(12) United States Patent
Min et al.

(10) Patent No.: US 11,715,803 B2
(45) Date of Patent: Aug. 1, 2023

(54) METHOD OF FORMING TRANSISTORS OF DIFFERENT CONFIGURATIONS

(71) Applicant: Taiwan Semiconductor Manufacturing Company, Ltd., Hsinchu (TW)

(72) Inventors: Wei-Lun Min, Hsinchu (TW); Chang-Miao Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/838,560

(22) Filed: Jun. 13, 2022

(65) Prior Publication Data
US 2022/0310851 A1 Sep. 29, 2022

Related U.S. Application Data

(62) Division of application No. 17/101,212, filed on Nov. 23, 2020, now Pat. No. 11,362,217.

(51) Int. Cl.
| | |
|---|---|
| *H01L 29/66* | (2006.01) |
| *H01L 29/786* | (2006.01) |
| *H01L 29/423* | (2006.01) |
| *H01L 29/06* | (2006.01) |
| *H01L 29/78* | (2006.01) |
| *H01L 29/10* | (2006.01) |

(52) U.S. Cl.
CPC .... *H01L 29/78696* (2013.01); *H01L 29/0649* (2013.01); *H01L 29/0673* (2013.01); *H01L 29/1033* (2013.01); *H01L 29/42392* (2013.01); *H01L 29/6656* (2013.01); *H01L 29/66439* (2013.01); *H01L 29/66545* (2013.01); *H01L 29/66575* (2013.01); *H01L 29/66818* (2013.01); *H01L 29/7851* (2013.01); *H01L 2029/7858* (2013.01)

(58) Field of Classification Search
CPC .......... H01L 29/78696; H01L 29/0653; H01L 29/0673; H01L 29/42392; H01L 29/66439; H01L 29/66545; H01L 29/6656; H01L 29/775; H01L 29/1033; H01L 29/66575; H01L 29/66818; H01L 29/7851; H01L 2029/7858
See application file for complete search history.

(56) References Cited

U.S. PATENT DOCUMENTS

| | | | |
|---|---|---|---|
| 9,276,064 B1 * | 3/2016 | Zang | H01L 29/161 |
| 9,818,872 B2 | 11/2017 | Ching et al. | |
| 9,881,998 B1 * | 1/2018 | Cheng | H01L 21/465 |
| 9,887,269 B2 | 2/2018 | Ching et al. | |

(Continued)

*Primary Examiner* — Earl N Taylor
(74) *Attorney, Agent, or Firm* — Haynes and Boone, LLP

(57) ABSTRACT

The present disclosure provides semiconductor devices and methods of forming the same. A semiconductor device of the present disclosure includes a first source/drain feature and a second source/drain feature over a substrate, a plurality of channel members extending between the first source/drain feature and the second source/drain feature, a gate structure wrapping around each of the plurality of channel members, and at least one blocking feature. At least one of the plurality of channel members is isolated from the first source/drain feature and the second source/drain feature by the at least one blocking feature.

20 Claims, 24 Drawing Sheets

(56) References Cited

U.S. PATENT DOCUMENTS

| | | | |
|---|---|---|---|
| 9,899,398 B1 | 2/2018 | Colinge et al. | |
| 9,947,804 B1* | 4/2018 | Frougier | H01L 29/66431 |
| 9,991,352 B1* | 6/2018 | Frougier | H01L 29/42364 |
| 10,032,627 B2 | 7/2018 | Lee et al. | |
| 10,109,721 B2 | 10/2018 | Lin et al. | |
| 10,134,840 B2* | 11/2018 | Yeh | H01L 29/66772 |
| 10,157,799 B2 | 12/2018 | Ching et al. | |
| 10,199,502 B2 | 2/2019 | Huang et al. | |
| 10,290,546 B2 | 5/2019 | Chiang et al. | |
| 10,475,902 B2 | 11/2019 | Lee et al. | |
| 10,756,216 B2* | 8/2020 | Miao | H01L 29/78696 |
| 11,081,568 B2* | 8/2021 | Yao | H01L 29/0653 |
| 11,205,698 B2* | 12/2021 | Ando | H01L 29/0653 |
| 2017/0110554 A1* | 4/2017 | Tak | H01L 29/42392 |
| 2017/0271514 A1* | 9/2017 | Kittl | H01L 29/7848 |
| 2018/0114833 A1* | 4/2018 | Bao | B82Y 10/00 |
| 2018/0175036 A1 | 6/2018 | Ching et al. | |
| 2018/0212038 A1* | 7/2018 | Chao | H01L 29/66545 |
| 2018/0315828 A1* | 11/2018 | Yamashita | H01L 29/66545 |
| 2019/0214314 A1* | 7/2019 | Seo | H01L 29/78696 |
| 2020/0051981 A1* | 2/2020 | Yang | H01L 21/02603 |
| 2020/0052124 A1* | 2/2020 | Miao | H01L 21/823431 |
| 2020/0279913 A1* | 9/2020 | Ebrish | H01L 29/1079 |
| 2020/0287021 A1* | 9/2020 | Wu | H01L 21/0245 |
| 2021/0273098 A1* | 9/2021 | Chang | H01L 29/66553 |
| 2021/0273114 A1* | 9/2021 | Chen | H01L 29/0847 |
| 2021/0351276 A1* | 11/2021 | Bao | H01L 27/092 |

* cited by examiner

METHOD OF FORMING TRANSISTORS OF DIFFERENT CONFIGURATIONS

PRIORITY DATA

This application is a divisional application of U.S. patent application Ser. No. 17/101,212, filed Nov. 23, 2020, the entirety of which is incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

With multiple channel members that are wrapped around by a gate structure, an MBC transistor provides good drive current performance by increasing the effective channel width. While existing methods for forming MBC transistors are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
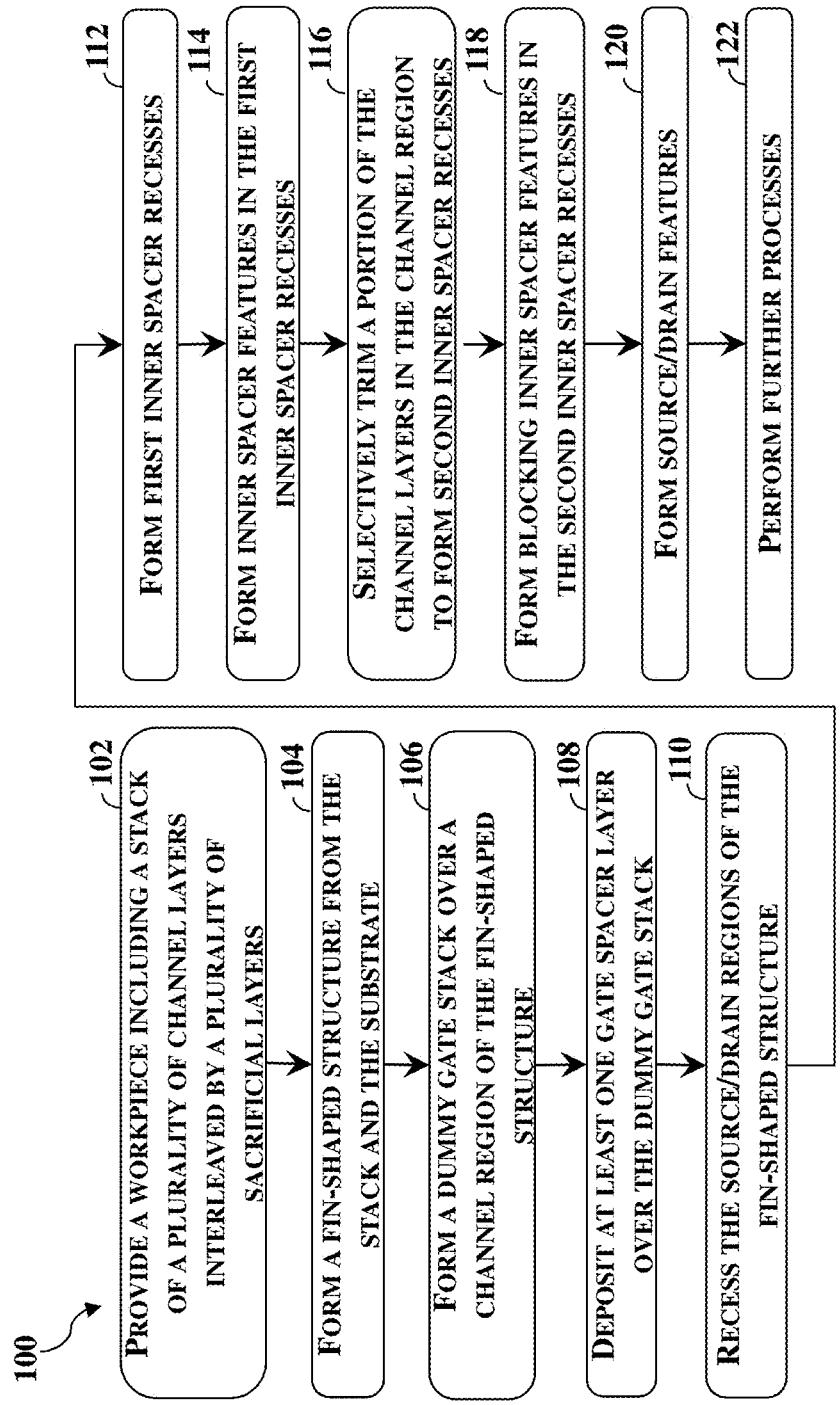
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to multi-gate transistors and fabrication methods, and more particularly to methods of fabricating MBC transistors of different configurations. Methods of the present disclosure may include a blocking feature formation process after the formation of inner spacer features. The blocking feature formation process may form blocking features to selectively shut off a predetermined number of channel members to modulate the effective resistance, effective capacitance, or drive current of an MBC transistor to meet various design needs. The blocking features are disposed between a to-be-shut-off channel member and adjacent source/drain features to electrically isolate the to-be-shut-off channel member. Methods of the present disclosure allow formation of MBC transistors that have similar dimensional but different effective channel widths.

The various aspects of the present disclosure will now be described in more detail with reference to the figures. In that regard, FIG. 1 is a flowchart illustrating a method 100 of forming a semiconductor device from a workpiece according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIG. 2-22, which are fragmentary cross-sectional views of workpiece 200 at different stages of fabrication according to embodiments of the method 100 in FIG. 1. Because the workpiece 200 will be fabricated into a semiconductor device, the workpiece 200 may be referred to herein as a semiconductor device 200 as the context requires. For avoidance of doubts, the X, Y and Z directions in FIGS. 2-20 are perpendicular to one another and are used consistently among the figures. Throughout the present disclosure, like reference numerals denote like features, unless otherwise excepted.

Figure 2:
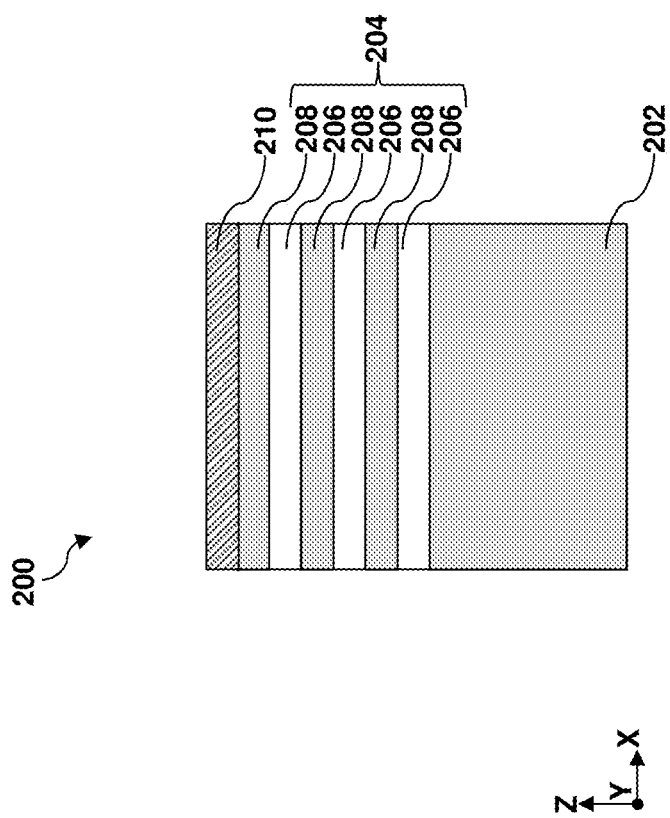
FIGS. 2-22 illustrate fragmentary cross-sectional views of a workpiece during a fabrication process according to the method of FIG. 1, according to one or more aspects of the present disclosure.

Referring to FIGS. 1 and 2, method 100 includes a block 102 where a workpiece 200 is provided. As shown in FIG. 2, the workpiece 200 includes a substrate 202. In some embodiments, the substrate 202 may be a semiconductor substrate such as a silicon (Si) substrate. The substrate 202 may also include other semiconductors such as germanium (Ge), silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) or a germanium-on-insulator (GeOI) structure, and/or may have other suitable enhancement features.

The workpiece 200 further includes a stack 204. In some embodiments represented in FIG. 2, the stack 204 includes sacrificial layers 206 of a first semiconductor composition interleaved by channel layers 208 of a second semiconductor composition. The first and second semiconductor composition may be different. In some embodiments, the sacrificial layers 206 include silicon germanium (SiGe) and the channel layers 208 include silicon (Si). It is noted that three (3) layers of the sacrificial layers 206 and three (3) layers of the channel layers 208 are alternately arranged as illustrated in FIG. 2, which is for illustrative purposes only and not intended to be limiting beyond what is specifically recited in the claims. It can be appreciated that any number of epitaxial layers may be formed in the stack 204. The number of layers depends on the desired number of channels members for the semiconductor device 200. In some embodiments, the number of channel layers 208 is between 2 and 10.

In some embodiments, all sacrificial layers 206 may have a substantially uniform first thickness between about 9 nm and about 10 nm and all of the channel layers 208 may have a substantially uniform second thickness between about 6 nm and about 8 nm. The first thickness and the second thickness may be identical or different. As described in more detail below, the channel layers 208 or parts thereof may serve as channel member(s) for a subsequently-formed multi-gate device and the thickness of each of the channel layers 208 is chosen based on device performance considerations. The sacrificial layers 206 in channel regions(s) may eventually be removed and serve to define a vertical distance between adjacent channel layers 208 for a subsequently-formed multi-gate device and the thickness of each of the sacrificial layers 206 is chosen based on device performance considerations.

The layers in the stack 204 may be deposited using a molecular beam epitaxy (MBE) process, a vapor phase deposition (VPE) process, and/or other suitable epitaxial growth processes. As stated above, in at least some examples, the sacrificial layers 206 include an epitaxially grown silicon germanium (SiGe) layer and the channel layers 208 include an epitaxially grown silicon (Si) layer. In some embodiments, the sacrificial layers 206 and the channel layers 208 are substantially dopant-free (i.e., having an extrinsic dopant concentration from about $0$ $cm^{-3}$ to about $1 \times 10^{17}$ $cm^{-3}$), where for example, no intentional doping is performed during the epitaxial growth processes for the stack 204.

Figure 3:
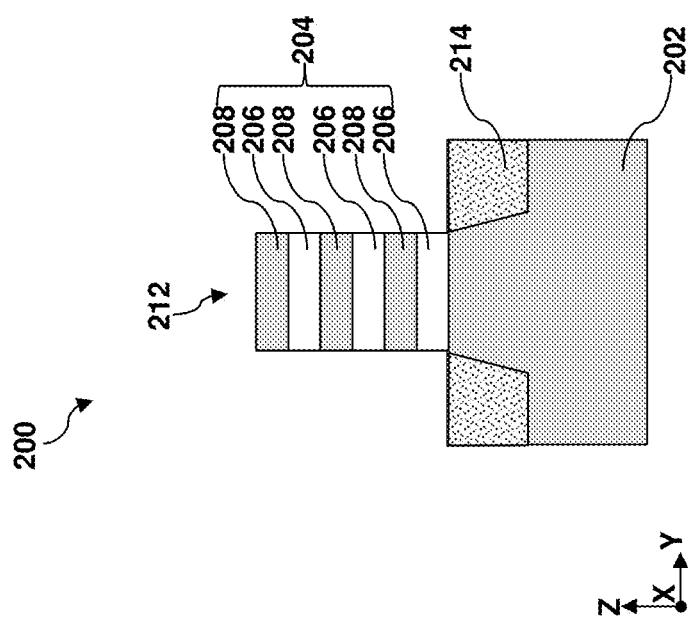

Referring still to FIGS. 1 and 3, method 100 includes a block 104 where a fin-shaped structure 212 is formed from the stack 204 and the substrate 202. It is noted that FIG. 2 includes a fragmentary cross-sectional view of the workpiece 200 along the Y direction while FIG. 3 illustrates a fragmentary cross-sectional view of the workpiece 200 along the X direction. To pattern the stack 204, a hard mask layer 210 (shown in FIG. 2) may be deposited over the stack 204 to form an etch mask. The hard mask layer 210 may be a single layer or a multi-layer. For example, the hard mask layer 210 may include a pad oxide layer and a pad nitride layer over the pad oxide layer. The fin-shaped structure 212 may be patterned from the stack 204 and the substrate 202 using lithography processes and etch processes. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching), wet etching, and/or other etching methods. As shown in FIG. 3, the etch process at block 104 forms trenches extending through the stack 204 and a portion of the substrate 202. The trenches define the fin-shaped structures 212. In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 212 by etching the stack 204. As shown in FIG. 3, the fin-shaped structure 212, along with the sacrificial layers 206 and the channel layers 208 therein, extends vertically along the Z direction and lengthwise along the X direction.

At block 104, an isolation feature 214 is formed adjacent the fin-shaped structure 212. In some embodiments, the isolation feature 214 may be formed in the trenches to isolate the fin-shaped structures 212 from a neighboring active region. The isolation feature 214 may also be referred to as a shallow trench isolation (STI) feature 214. By way of example, in some embodiments, a dielectric layer is first deposited over the substrate 202, filling the trenches with the dielectric layer. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, a spin-on coating process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI feature 214. The fin-shaped structure 212 rises above the STI feature 214 after the recessing.

Figure 4:
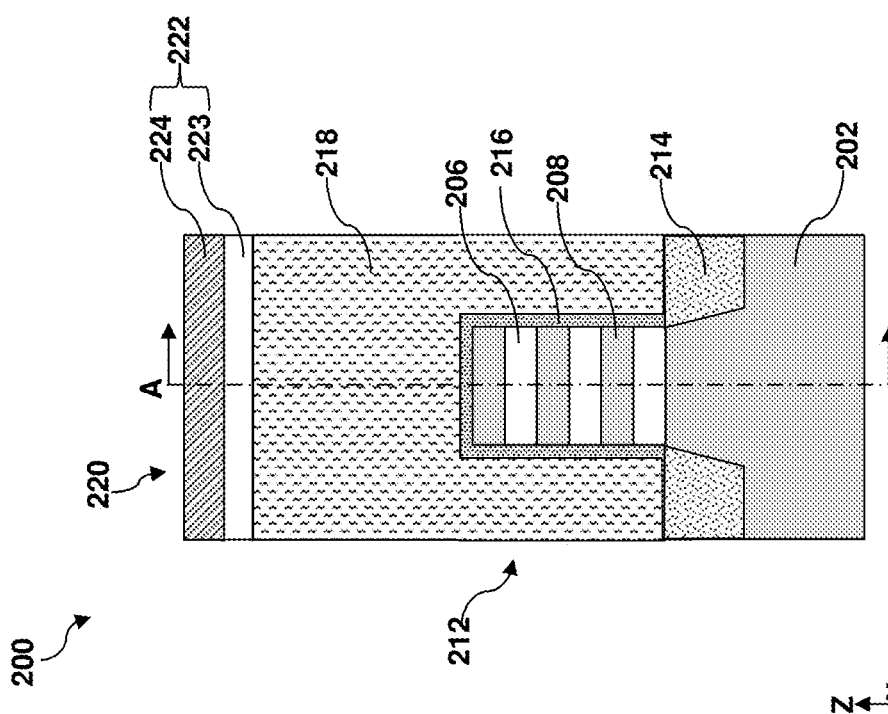
Figure 5:
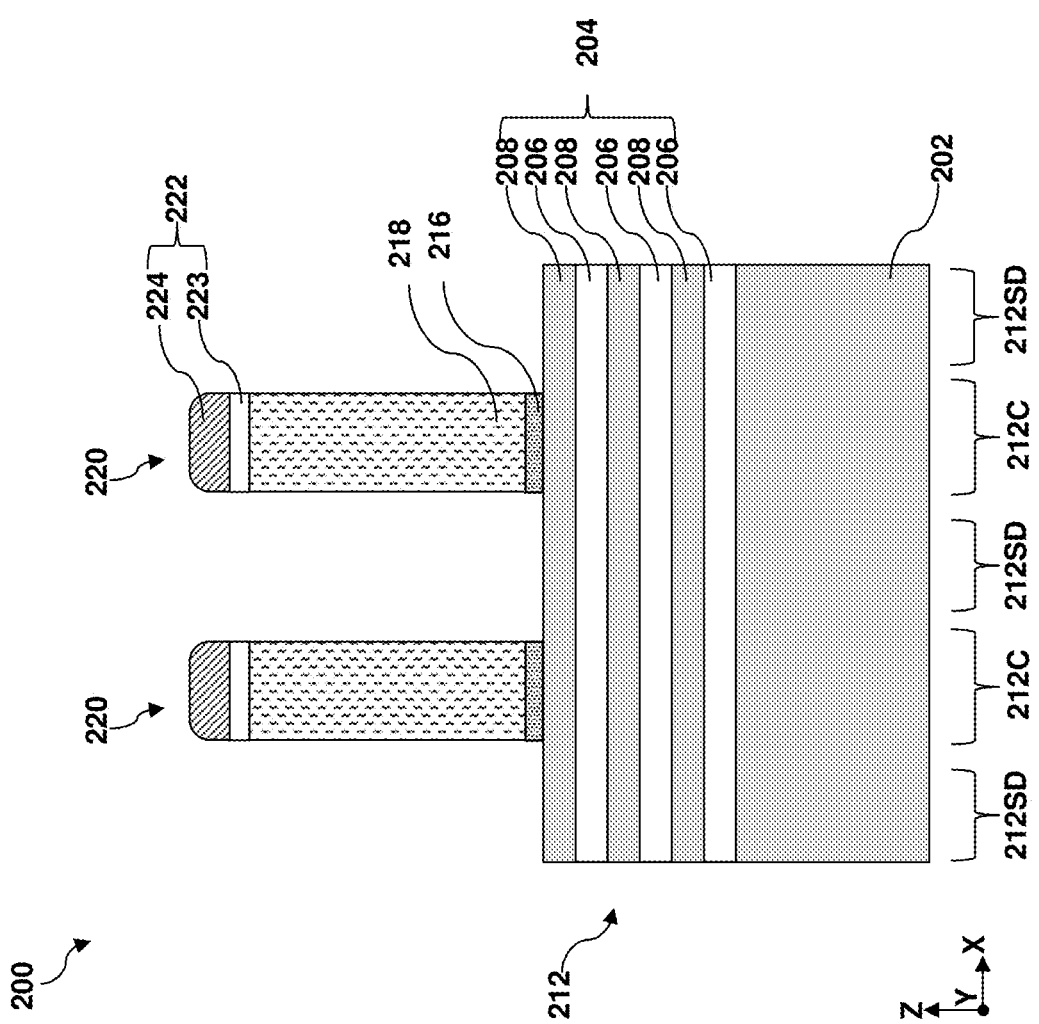

Referring to FIGS. 1, 4 and 5, method 100 includes a block 106 where a dummy gate stack 220 is formed over a channel region 212C of the fin-shaped structure 212. It is noted that FIG. 3 and FIG. 4 share the same viewing angle (along the X direction) while FIG. 5 shares the same viewing angle (along the Y direction) with FIG. 2. In some embodiments, a gate replacement process (or gate-last process) is adopted where the dummy gate stack 220 (shown in FIGS. 4 and 5) serves as a placeholder to undergo various processes and is to be removed and replaced by the functional gate structure. Other processes and configuration are possible. In some embodiments illustrated in FIG. 5, the dummy gate stack 220 is formed over the fin-shaped structure 212 and the fin-shaped structure 212 may be divided into channel regions 212C underlying the dummy gate stacks 220 and source/drain regions 212SD that do not underlie the dummy gate stacks 220. The channel regions 212C are adjacent the source/drain regions 212SD. As shown in FIG. 5, the channel region 212C is disposed between two source/drain regions 212SD along the X direction.

The formation of the dummy gate stack 220 may include deposition of layers in the dummy gate stack 220 and patterning of these layers. Referring to FIG. 4, a dummy dielectric layer 216, a dummy electrode layer 218, and a gate-top hard mask layer 222 may be deposited over the workpiece 200. In some embodiments, the dummy dielectric layer 216 may be formed on the fin-shaped structure 212 using a chemical vapor deposition (CVD) process, an ALD process, an oxygen plasma oxidation process, a thermal oxidation process, or other suitable processes. In some instances, the dummy dielectric layer 216 may include silicon oxide. When the dummy dielectric layer 216 is formed using an oxidation process, it may be selectively formed on exposed surfaces of the fin-shaped structure 212, as illustrated in FIG. 4. Thereafter, the dummy electrode layer 218 may be deposited over the dummy dielectric layer 216 using a CVD process, an ALD process, or other suitable processes. In some instances, the dummy electrode layer 218 may include polysilicon (poly Si). For patterning purposes, the gate-top hard mask layer 222 may be deposited on the dummy electrode layer 218 using a CVD process, an ALD process, or other suitable processes. The gate-top hard mask layer 222, the dummy electrode layer 218 and the dummy dielectric layer 216 may then be patterned to form the dummy gate stack 220, as shown in FIG. 5. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the gate-top hard mask layer 222 may include a silicon oxide layer 223 and a silicon nitride layer 224 over the silicon oxide layer 223. As shown in FIG. 5, no dummy gate stack 220 is disposed over the source/drain region 212SD of the fin-shaped structure 212.

Figure 6:
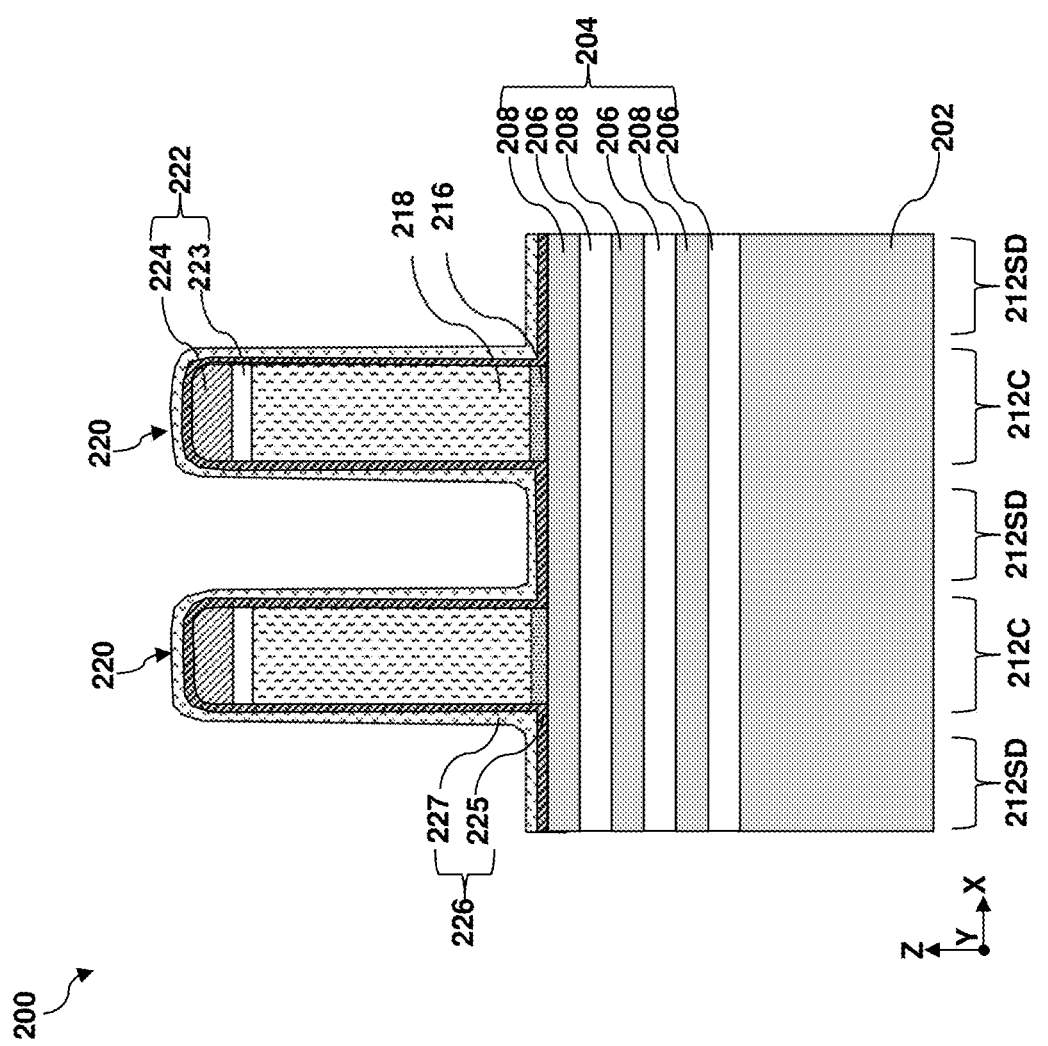

Referring to FIGS. 1 and 6, method 100 includes a block 108 where at least one gate spacer layer 226 is deposited over the dummy gate stack 220. In some embodiments, the at least one gate spacer layer 226 is deposited conformally over the workpiece 200, including over top surfaces and sidewalls of the dummy gate stack 220. The term "conformally" may be used herein for ease of description of a layer having substantially uniform thickness over various regions. The at least one gate spacer layer 226 may be a single layer or a multi-layer. In the depicted embodiments, the at least one gate spacer layer 226 includes a first spacer layer 225 and a second spacer layer 227 disposed over the first spacer layer 225. A composition of the first spacer layer 225 may be different from a composition of the second spacer layer 227. In some implementation, a dielectric constant of the first spacer layer 225 is greater than a dielectric constant of the second spacer layer 227. The at least one gate spacer layer 226, including the first spacer layer 225 and the second spacer layer 227, may include silicon oxide, silicon carbonitride, silicon oxycarbide, silicon oxycarbonitride, or silicon nitride. The at least one gate spacer layer 226 may be deposited over the dummy gate stack 220 using processes such as, a CVD process, a subatmospheric CVD (SACVD) process, an ALD process, or other suitable process. For ease of reference, the at least one gate spacer layer 226 may also be referred to the gate spacer layer 226 or top gate spacer layer 226.

Figure 7:
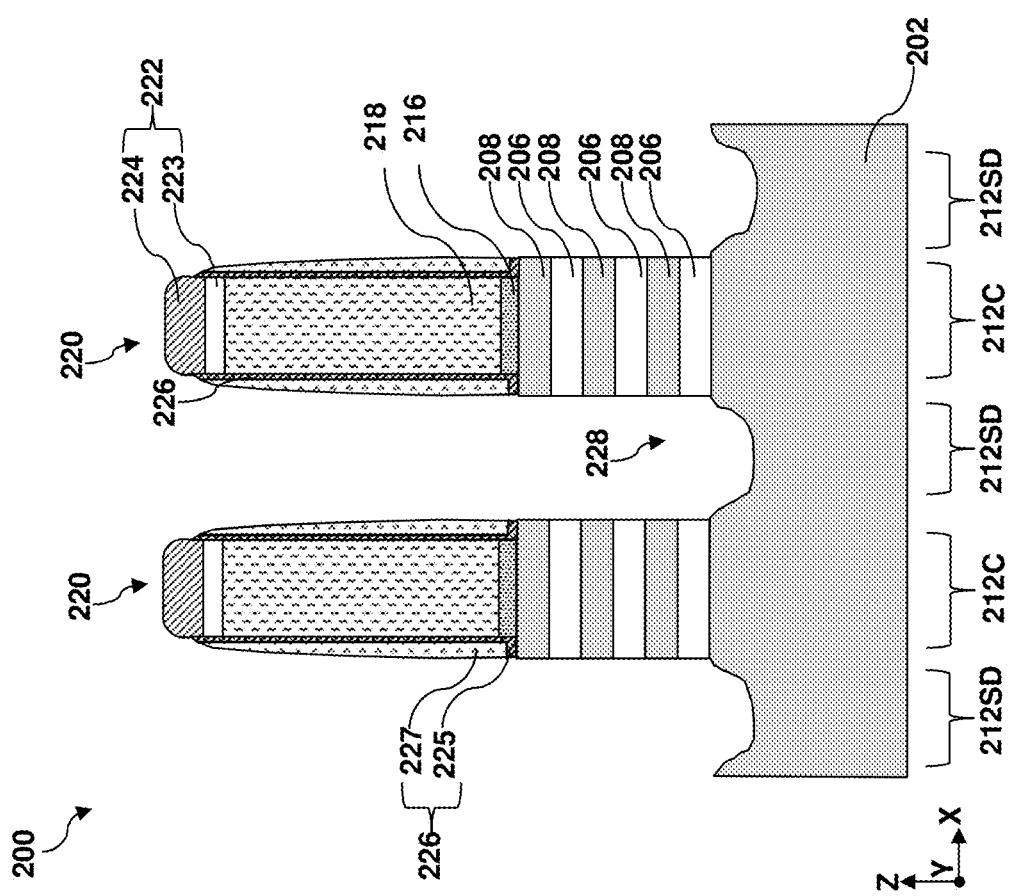

Referring to FIGS. 1 and 7, method 100 includes a block 110 where a source/drain region 212SD of the fin-shaped structure 212 is recessed to form a source/drain trench 228. In some embodiments, the source/drain regions 212SD that are not covered by the dummy gate stack 220 and sidewall portions of the gate spacer layer 226 are etched by a dry etch or a suitable etching process to form the source/drain trenches 228. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In some embodiments represented in FIG. 7, the source/drain regions 212SD of the fin-shaped structure 212 are recessed to expose sidewalls of the sacrificial layers 206 and the channel layers 208. In some implementations, the source/drain trenches 228 extend below the stack 204 into the substrate 202. FIG. 7 illustrates a cross-sectional view of the workpiece 200 viewed along the Y direction at the source/drain region 212SD. As shown in FIG. 7, the sacrificial layers 206 and channel layers 208 in the source/drain region 212SD are removed at block 110, exposing surfaces of the substrate 202 in the bottom of the source/drain trenches 228.

Figure 8:
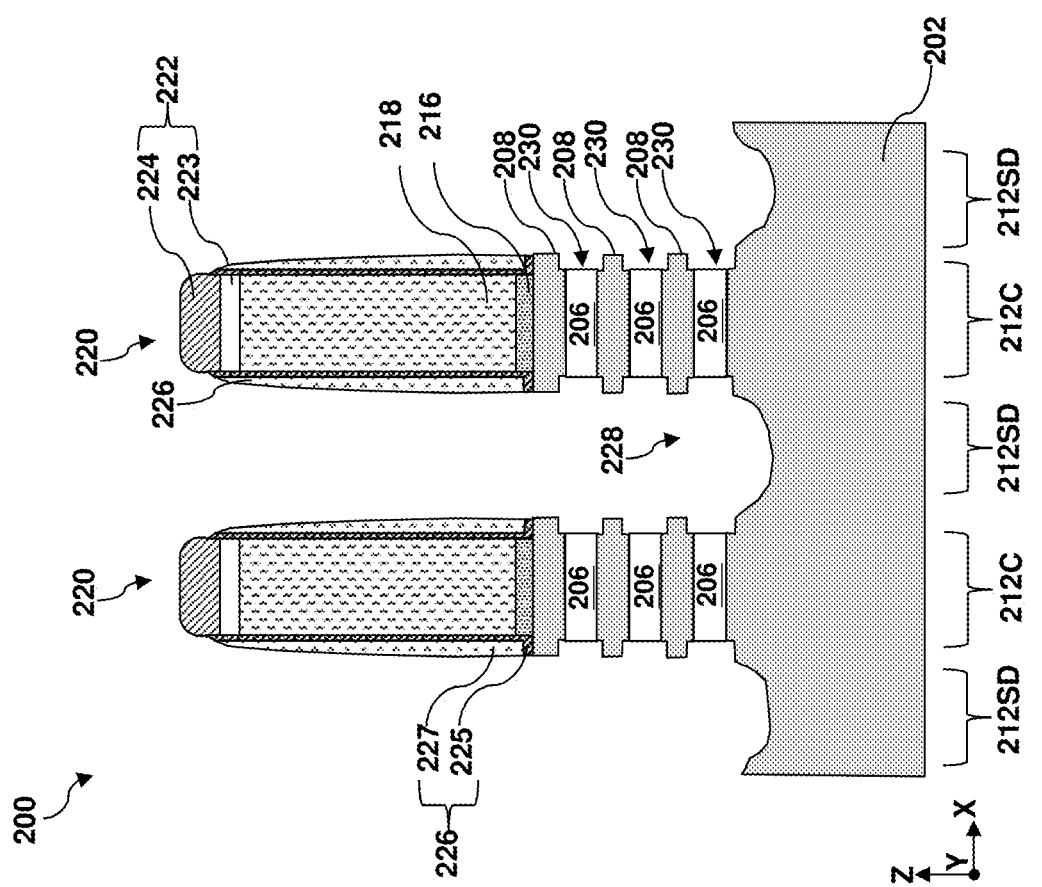

Referring to FIGS. 1 and 8, method 100 includes a block 112 where the sacrificial layers 206 are partially and selectively recessed to form first inner spacer recesses 230. The sacrificial layers 206 exposed in the source/drain trenches 228 are selectively and partially recessed to form first inner spacer recesses 230 while the gate spacer layer 226, the exposed portion of the substrate 202, and the channel layers 208 are substantially unetched. In an embodiment where the channel layers 208 consist essentially of silicon (Si) and sacrificial layers 206 consist essentially of silicon germanium (SiGe), the selective recess of the sacrificial layers 206 may be performed using a selective wet etch process or a selective dry etch process. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture). While the etch process at block 112 is selective, the exposed edge portions of the channel layers 208 may still be moderately etched or trimmed, as shown in FIG. 8.

Figure 9:
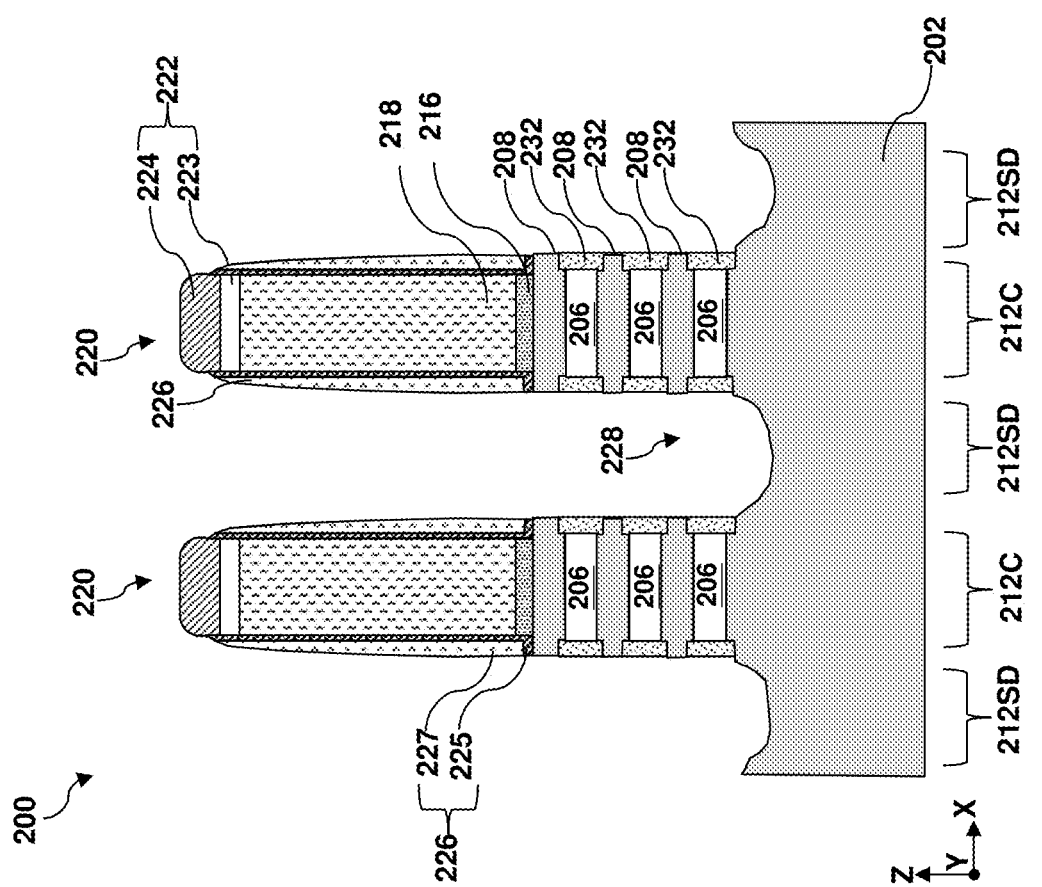

Referring to FIGS. 1 and 9, method 100 includes a block 114 where inner spacer features 232 are deposited into the first inner spacer recesses 230. After the first inner spacer recesses 230 are formed, an inner spacer material layer is conformally deposited over the workpiece 200, including into the first inner spacer recesses 230. The inner spacer material layer may include metal oxides, silicon oxide, silicon oxycarbonitride, silicon nitride, silicon oxynitride, carbon-rich silicon carbonitride, or a low-k dielectric material. The metal oxides may include aluminum oxide, zirconium oxide, tantalum oxide, yttrium oxide, titanium oxide, lanthanum oxide, or other suitable metal oxide. While not explicitly shown, the inner spacer material layer may be a single layer or a multilayer. In some implementations, the inner spacer material layer may be deposited using CVD, PECVD, SACVD, ALD or other suitable methods. The deposited inner spacer material layer is then etched back to remove the inner spacer material layer from the sidewalls of the channel layers 208 to form the inner spacer features 232 in the first inner spacer recesses 230. In some implementations, the etch back operations performed at block 114 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 9, upon conclusion of the operations at block 114, each of the inner spacer features 232 covers an end surface of a sacrificial layer 206.

Figure 10:
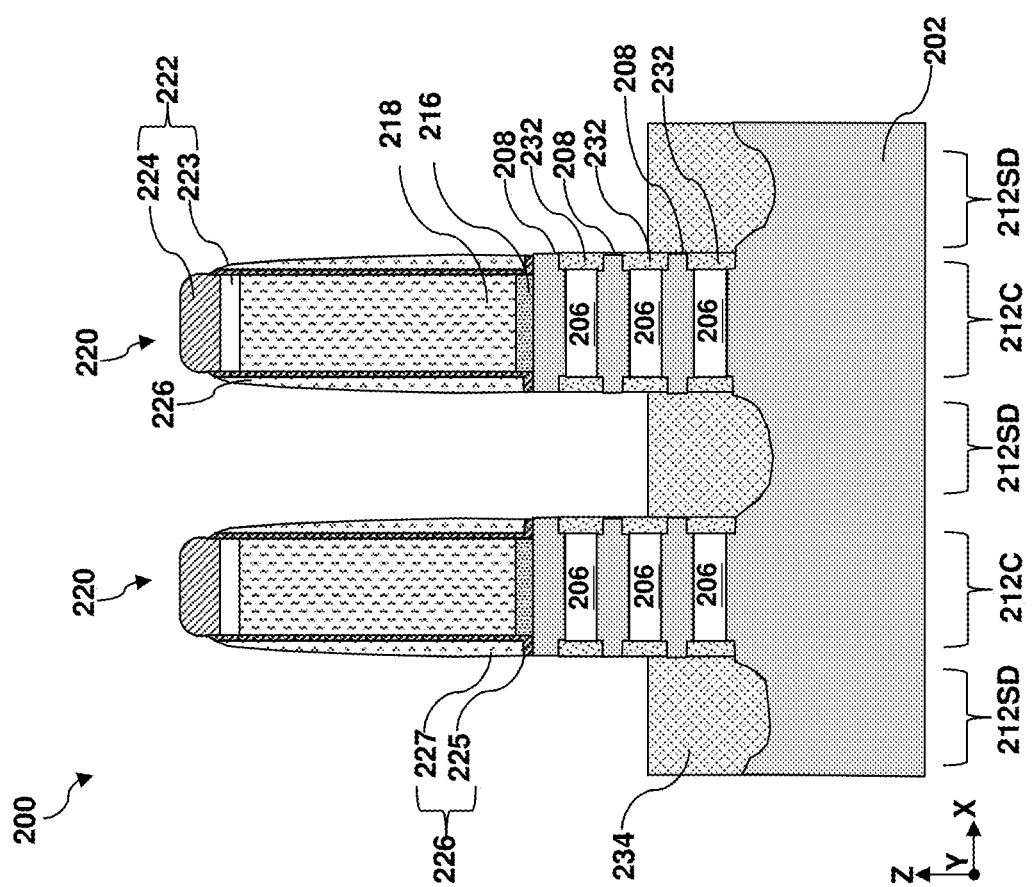
Figure 11:
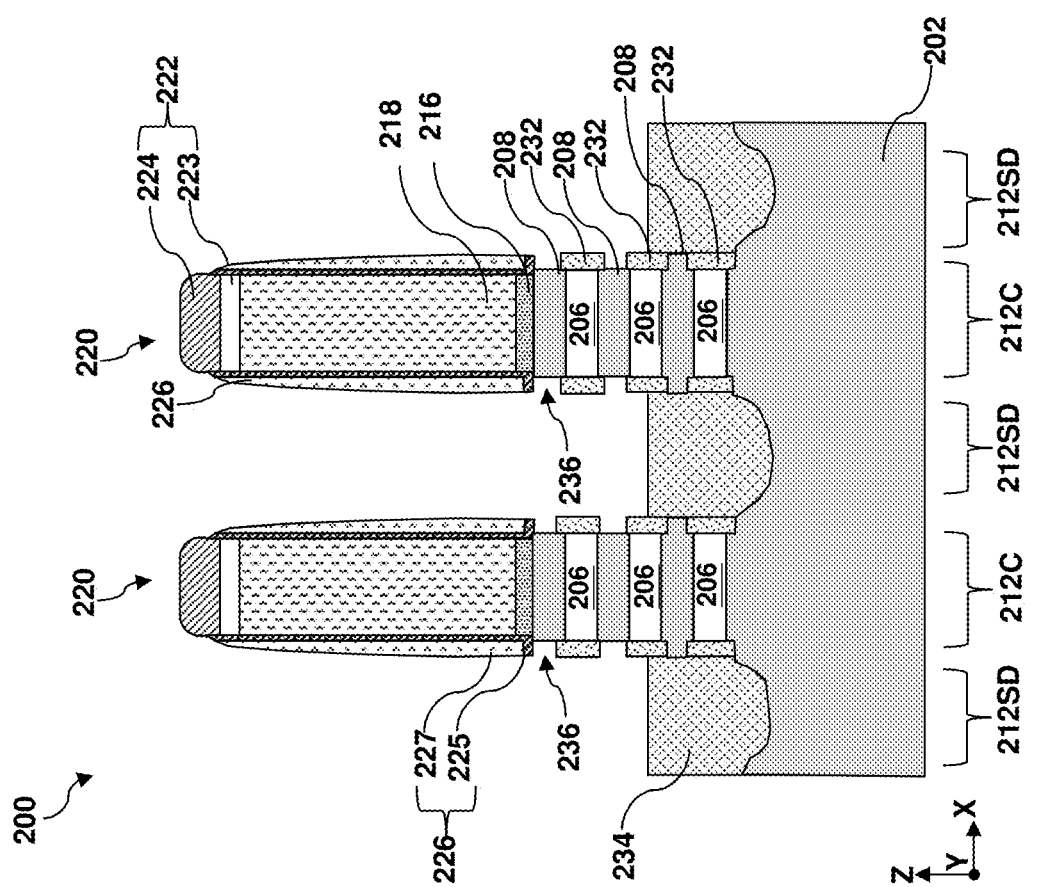
Figure 12:
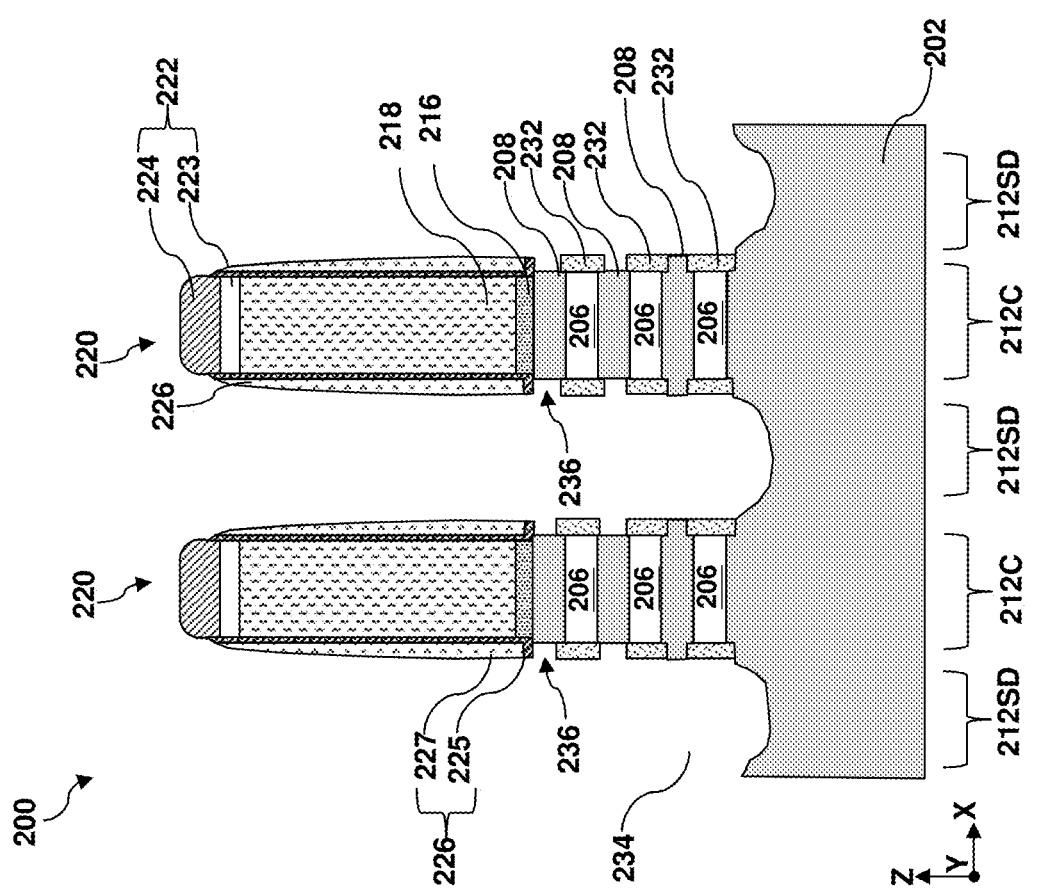

Referring to FIGS. 1, 10, 11, and 12, method 100 includes a block 116 where a portion of the channel layers 208 in the channel regions 212C is selectively trimmed to form second inner spacer recesses 236. In some embodiments, the portion of the channel layers 208 to be selectively trimmed is controlled by a thickness of a bottom antireflective coating (BARC) layer 234. In other words, the number of channel layers 208 to be selectively trimmed may be controlled by controlling the thickness of the BARC layer 234. As will be described further below, the number of channel layers 208 to be selectively trimmed and eventually shut-off or blocked off is determined by the design for the semiconductor device 200. An example process for selectively trimming a portion of the channel layers 208 to form second inner spacer recesses 236 is illustrated in FIGS. 10-12. Referring to FIG. 10, the BARC layer 234 may be deposited over the workpiece 200 by spin-on coating or a suitable deposition process. In some implementations, the BARC layer 234 may include polysulfones, polyureas, polyurea sulfones, polyacrylates, poly(vinyl pyridine), or a silicon-containing polymer. In some instances, the deposited BARC layer 234 is not deposited directly to the desired height. Instead, it is deposited to a height to a thickness greater than a designed thickness and is then etched back until a desired height is reached. The etch back of the BARC layer 234 may include a dry etch process that uses a hydrogen plasma, an oxygen plasma, or a combination thereof. In the embodiment depicted in FIG. 10, the etched backed BARC layer 234 covers and protects the bottommost channel layer 208 while the other channel layers 208 remained exposed. As will also be described below, depending on the design for the semiconductor device 200, the BARC layer 234 may be recessed to cover more or less channel layers 208. For example, when all channel layers 208 in one device region are to be shut-off, the BARC layer 234 is allowed to cover all end surfaces of the channel layers 208. For another example, when none of the channel layers 208 in another device region are to be shut-off, the BARC layer 234 does not cover any of the end surfaces of the channel layers 208.

Referring to FIG. 11, the channel layers 208 in the channel regions 212C that are not protected by the BARC layer 234 are selectively trimmed along the X direction to form the second inner spacer recesses 236. The trimming at block 116 is selective to the channel layers 208 and etches the gate spacer layer 226, the inner spacer features 232 and the BARC layer 234 at a reduced rate. In some embodiments, the selective trimming of the exposed channel layers 208 may include a selective wet etch process that uses a mixture of nitric acid and hydrofluoric acid, ethylenediamine pyrocatechol (EDP), tetramethylammonium hydroxide (TMAH), or a suitable wet etchant. In some other embodiments, the selective trimming of the exposed channel layers 208 may include a selective wet etch process that uses plasma of fluorine-containing species (e.g. $CF_4$, $SF_6$, $NF_3$, or $CCl_2F_2$) or chlorine-containing species (e.g. $Cl_2$, $CCl_2F_2$). In some instances, a depth of the second inner spacer recesses 236 may be substantially similar to a depth of the first inner spacer recesses 230 along the X direction. In FIG. 11, the bottommost channel layer 208 is protected by the BARC layer 234 and is not trimmed at block 116. Referring to FIG. 12, after the selective trimming of the exposed channel layers 208, the BARC layer 234 may be removed by using a suitable dry etch process or a suitable wet etch process.

Figure 13:
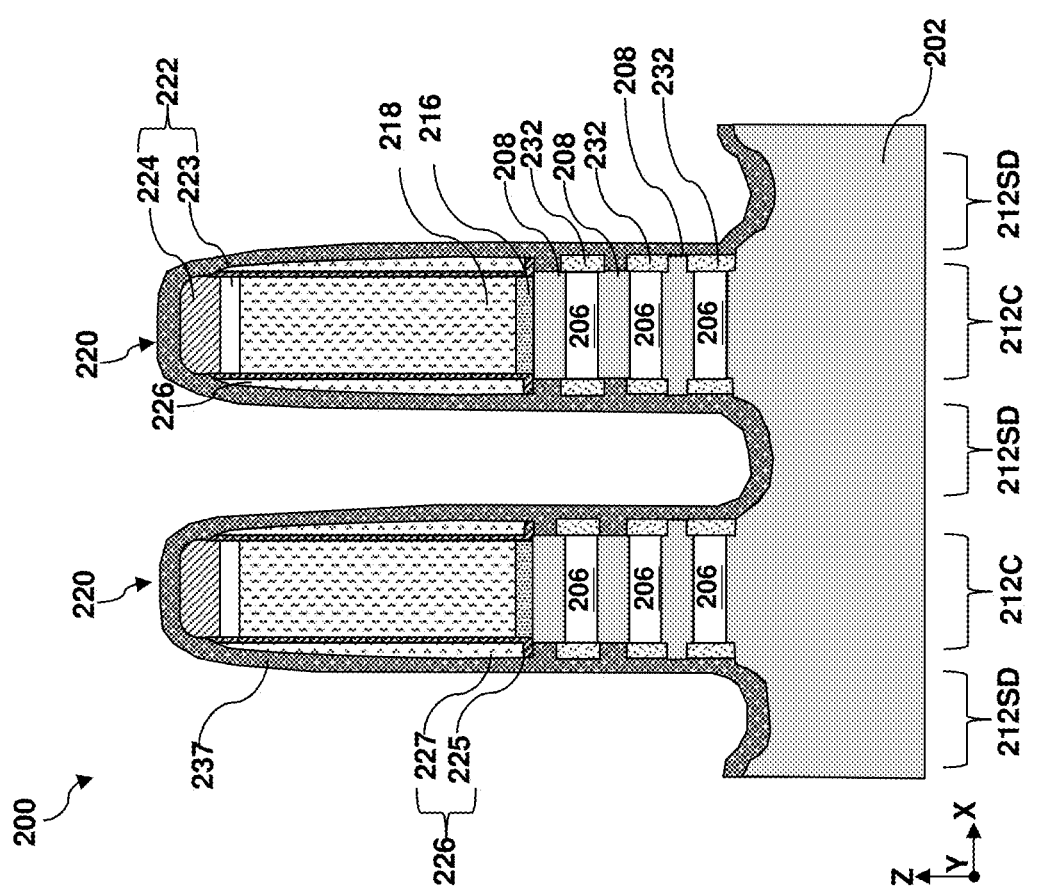
Figure 14:
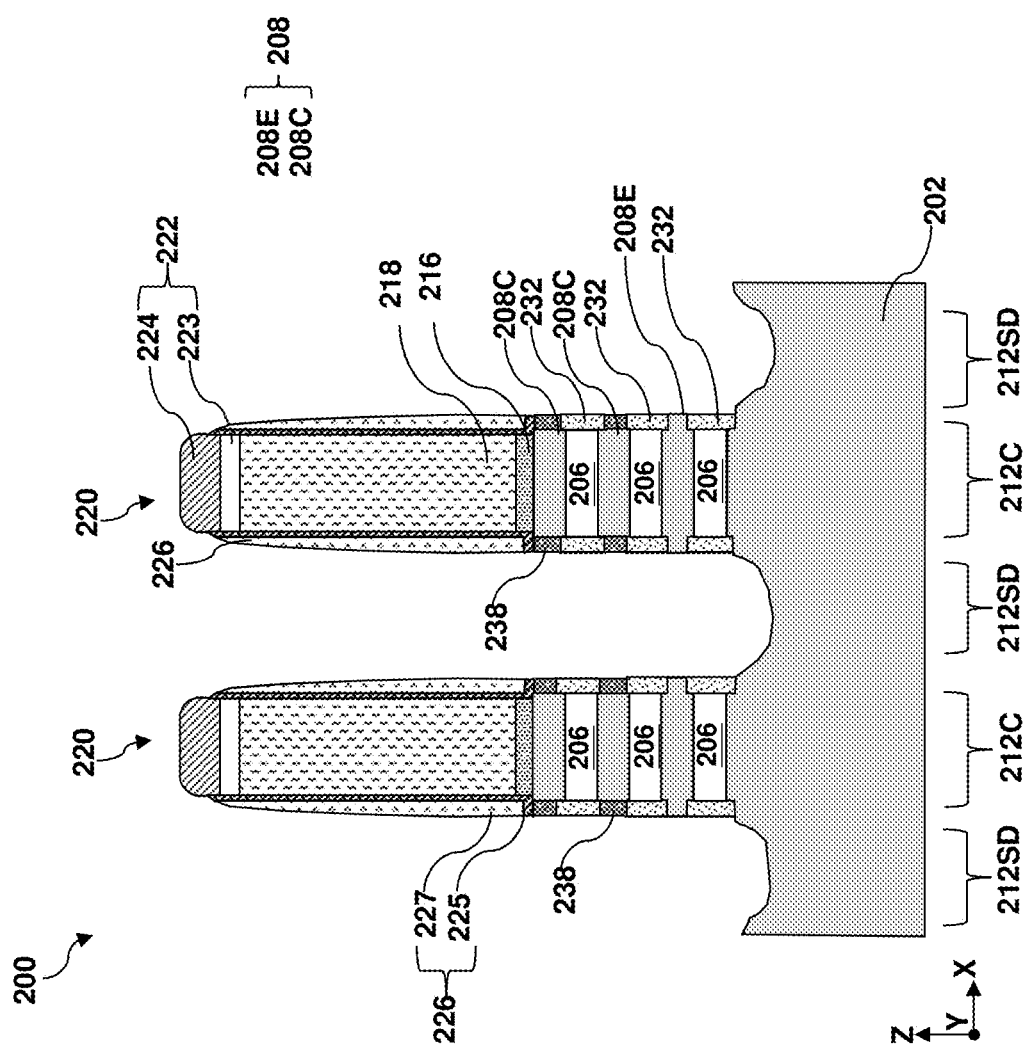

Referring to FIGS. 1, 13 and 14, method 100 includes a block 118 where blocking inner spacer features 238 are formed in the second inner spacer recesses 236. After the second inner spacer recesses 236 are formed, a blocking inner spacer material layer 237 is conformally deposited over the workpiece 200, including into the second inner spacer recesses 236. A composition of the blocking inner spacer material layer 237 may be similar to that of the inner spacer features 232. In some embodiments, the blocking inner spacer material layer 237 may include metal oxides, silicon oxide, silicon oxycarbonitride, silicon nitride, silicon oxynitride, carbon-rich silicon carbonitride, or a low-k dielectric material. The metal oxides may include aluminum oxide, zirconium oxide, tantalum oxide, yttrium oxide, titanium oxide, lanthanum oxide, or other suitable metal oxide. In some implementations, the blocking inner spacer material layer 237 may be deposited using CVD, PECVD, SACVD, ALD or other suitable methods. The deposited blocking inner spacer material layer 237 is then etched back to remove the blocking inner spacer material layer 237 from the sidewalls of the inner spacer features 232 and the gate spacer layer 226, thereby forming the blocking inner spacer features 238 in the second inner spacer recesses 236. In some implementations, the etch back operations performed at block 118 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 14, upon conclusion of the operations at block 118, each of the blocking inner spacer features 238 caps off end surfaces of the channel layers 208 that are not protected by the BARC layer 234. In that sense the blocking inner spacer features 238 may also be referred to as blocking features 238 or deactivation features 238.

Reference is still made to FIG. 14. For ease of reference and identification, the channel layers 208 that are covered by the blocking features 238 are referred to hereinafter as covered channel layers 208C and the channel layers 208 that are not covered by the blocking features 238 are referred to hereinafter as exposed channel layers 208E. The covered channel layers 208C and the exposed channel layers 208E may be referred collectively as channel layers 208. In the embodiments represented in FIG. 14, the workpiece 200 includes one exposed channel layer 208E and two covered channel layers 208C. Due to the selectively trimming at block 116, a length of the exposed channel layer 208E along the X direction is greater than a length of the covered channel layer 208C by about two times the thicknesses of the blocking features 238.

Figure 15:
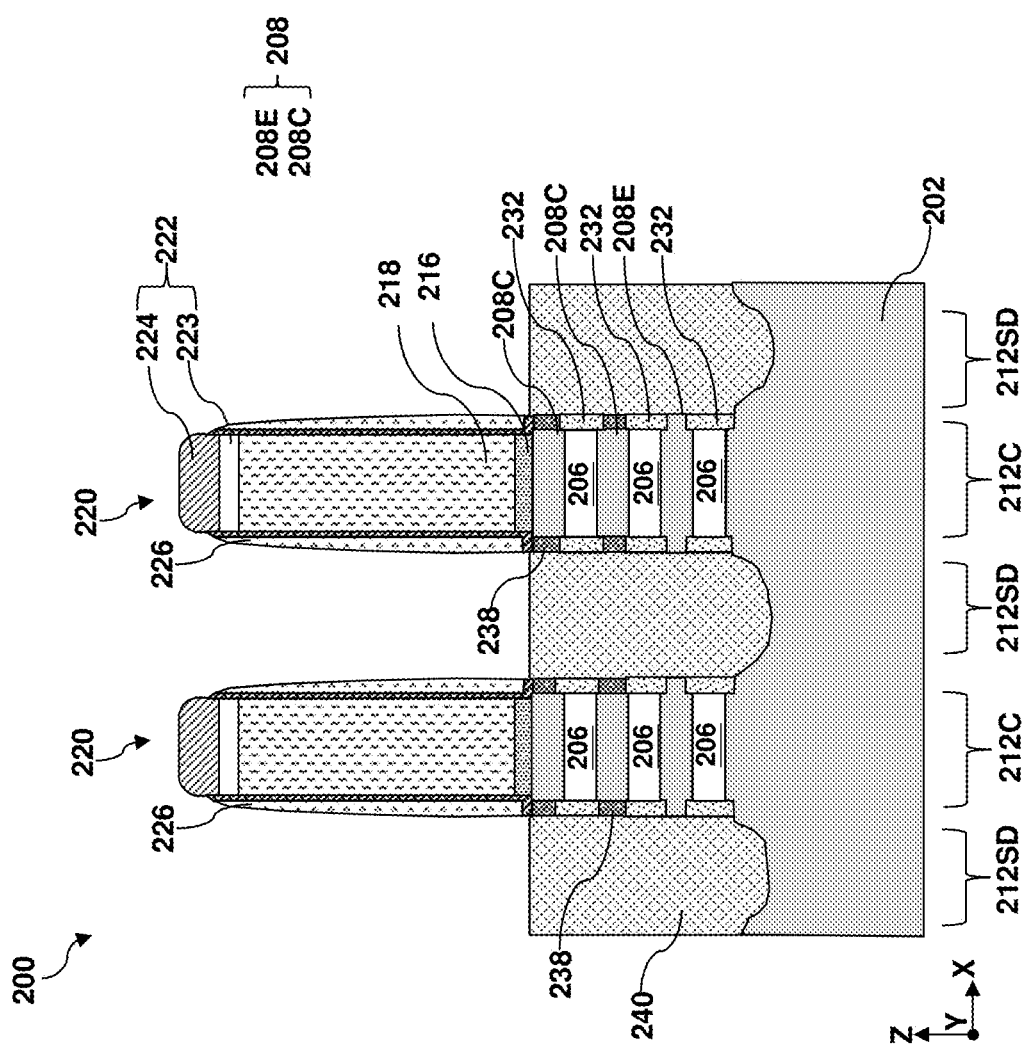

Referring to FIGS. 1 and 15, method 100 includes a block 120 where source/drain features 240 are formed over the source/drain regions 212SD. The source/drain feature 240 may be epitaxially and selectively formed from the sidewalls of the exposed channel layer 208E and exposed surfaces of the substrate 202, while sidewalls of the sacrificial layers 206 remain covered by the inner spacer features 232 and sidewalls of the covered channel layers 208C remain covered by the blocking features 238. Suitable epitaxial processes for block 120 include vapor-phase epitaxy (VPE), ultra-high vacuum CVD (UHV-CVD), molecular beam epitaxy (MBE), and/or other suitable processes. The epitaxial growth process at block 120 may use gaseous precursors, which interact with the composition of the substrate 202 and the channel layers 208. In some embodiments represented in FIG. 15, overgrowth of the source/drain feature 240 may extend over sidewalls of the inner spacer feature 232 and the blocking features 238. Depending on the conductivity type of the MBC transistor on the semiconductor device 200, the source/drain feature 240 may have different compositions. When the MBC transistor is n-type, the source/drain feature 240 may include silicon (Si) and may be doped with an n-type dopant, such as phosphorus (P) or arsenic (As). When the MBC transistor is p-type, the source/drain feature 240 may include silicon germanium (SiGe) and is doped with a p-type dopant, such as boron (B) or gallium (Ga). While not explicitly shown in FIG. 15, the source/drain feature 240 may include two or more epitaxial layers. For example, the source/drain feature 240 may include a first epitaxial layer, a second epitaxial layer, and a third epitaxial layer that are doped with the same type of dopant but at different doping concentrations to reduce defect density and contact resistance. In one embodiment, the source/drain feature 240 may include phosphorus-doped silicon (Si:P) when n-type MBC transistors are desired and may include boron-doped silicon germanium (SiGe:B) when p-type MBC transistors are desired. As shown in FIG. 15, while the exposed channel layer 208E extends between and are coupled to the source/drain features 240, the covered channel layers 208C are insulated or separated from the source/drain features 240 by the blocking features 238.

Figure 16:
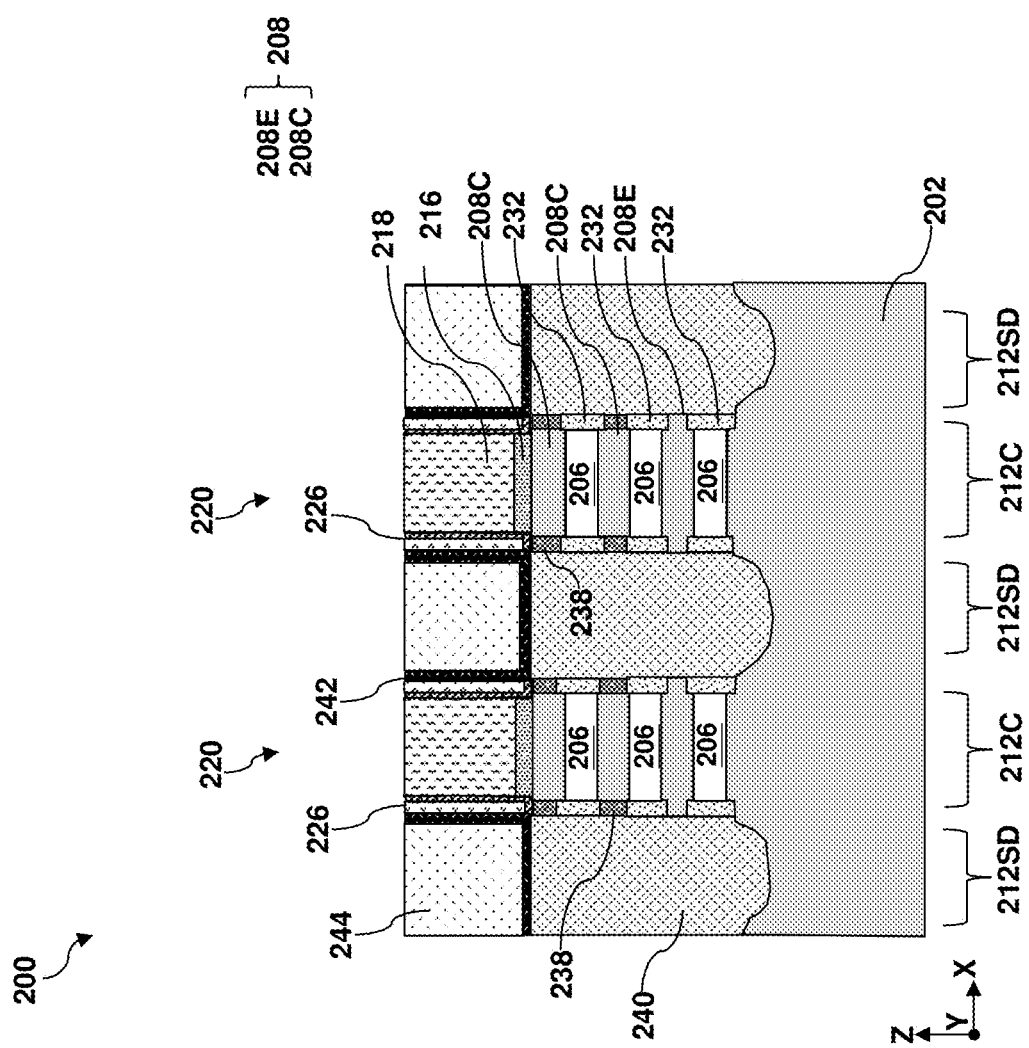

Referring to FIGS. 1 and 16-19, method 100 includes a block 122 where further processes are performed. Such further processes may include, for example, deposition of a contact etch stop layer (CESL) 242 over the workpiece 200 (shown in FIG. 16), deposition of an interlayer dielectric (ILD) layer 244 over the CESL 242 (shown in FIG. 16), removal of the dummy gate stack 220 (shown in FIG. 17), selective removal of the sacrificial layers 206 in the channel region 212C to release the channel layers 208 as channel members 2080 (shown in FIG. 18), and formation of a gate structure 260 over the channel region 212C (shown in FIG. 19). Referring now to FIG. 16, the CESL 242 is formed prior to forming the ILD layer 244. In some examples, the CESL 242 includes silicon nitride, silicon oxynitride, and/or other materials known in the art. The CESL 242 may be formed by ALD, plasma-enhanced chemical vapor deposition (PECVD) process and/or other suitable deposition processes. The ILD layer 244 is then deposited over the CESL 242. In some embodiments, the ILD layer 244 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be deposited by a PECVD process or other suitable deposition technique. In some embodiments, after formation of the ILD layer 244, the workpiece 200 may be annealed to improve integrity of the ILD layer 244. As shown in FIG. 16, the CESL 242 may be disposed directly on top surfaces of the source/drain features 240.

Figure 17:
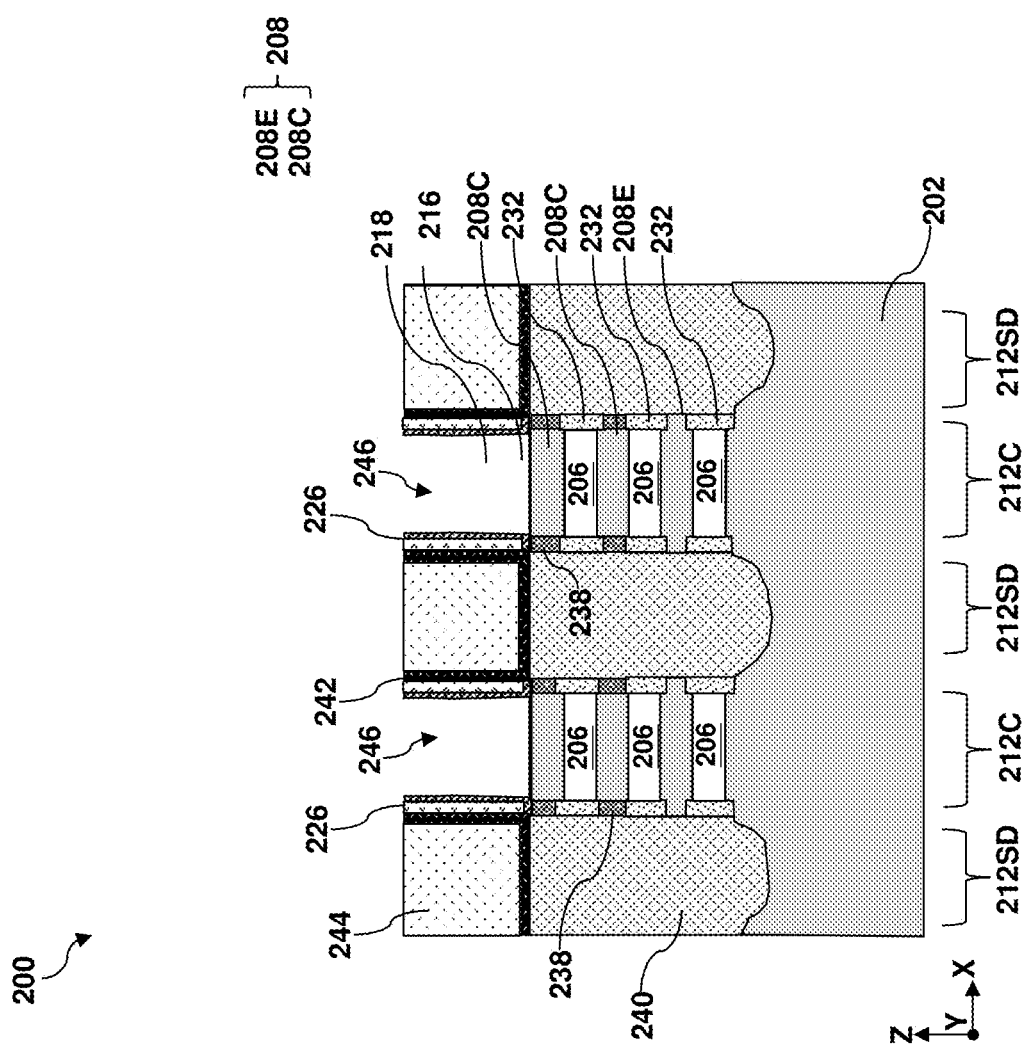

Referring still to FIG. 16, after the deposition of the CESL 242 and the ILD layer 244, the workpiece 200 may be planarized by a planarization process to expose the dummy gate stack 220. For example, the planarization process may include a chemical mechanical planarization (CMP) process. Exposure of the dummy gate stack 220 allows the removal of the dummy gate stack 220 and release of the channel layers 208 (including the covered channel layers 208C and the exposed channel layers 208E) from the sacrificial layers 206. The removal of the dummy gate stack 220 results in a gate trench 246 over the channel regions 212C, as shown in FIG. 17. The removal of the dummy gate stack 220 may include one or more etching processes that are selective to the material of the dummy gate stack 220. For example, the removal of the dummy gate stack 220 may be performed using as a selective wet etch, a selective dry etch, or a combination thereof that is selective to the dummy gate stack 220. After the removal of the dummy gate stack 220, sidewalls of the channel layers 208 (including the covered channel layers 208C and the exposed channel layers 208E) and the sacrificial layers 206 in the channel region 212C are exposed in the gate trench 246.

Figure 18:
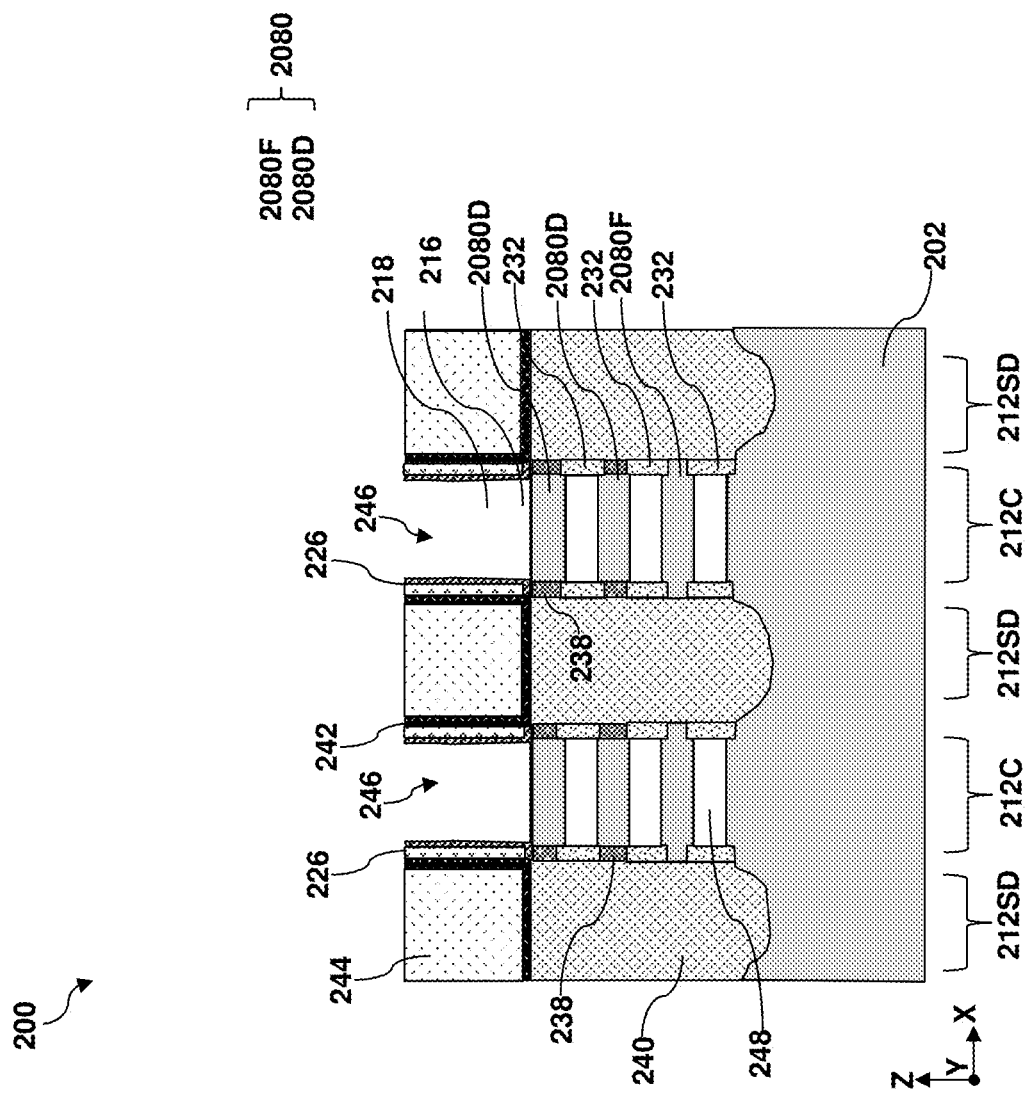

Referring to FIG. 18, after the removal of the dummy gate stack 220, the method 100 may include operations to selectively remove the sacrificial layers 206 between the channel layers 208 (including the covered channel layers 208C and the exposed channel layers 208E) in the channel region 212C. The selective removal of the sacrificial layers 206 releases the channel layers 208 (including the covered channel layers 208C and the exposed channel layers 208E) in FIG. 17 to form channel members shown in FIG. 18. As illustrated in FIG. 18, the exposed channel layers 208E are released as functional channel members 2080F and the covered channel layers 208C are released as dummy channel members 2080D. Because the exposed channel layer 208E in FIG. 17 is the bottommost channel layer that is closest to the substrate, the released functional channel member 2080F is also the bottommost channel member in FIG. 18. For ease of reference, the functional channel members 2080F and dummy channel members 2080D may be collectively referred to as channel members 2080 throughout the present disclosure. The selective removal of the sacrificial layers 206 also leaves behind space 248 between channel members 2080. The selective removal of the sacrificial layers 206 may be implemented by selective dry etch, selective wet etch, or other selective etch processes. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture). The selectively removal of the sacrificial layers 206 may be referred to as a channel release process.

Figure 19:
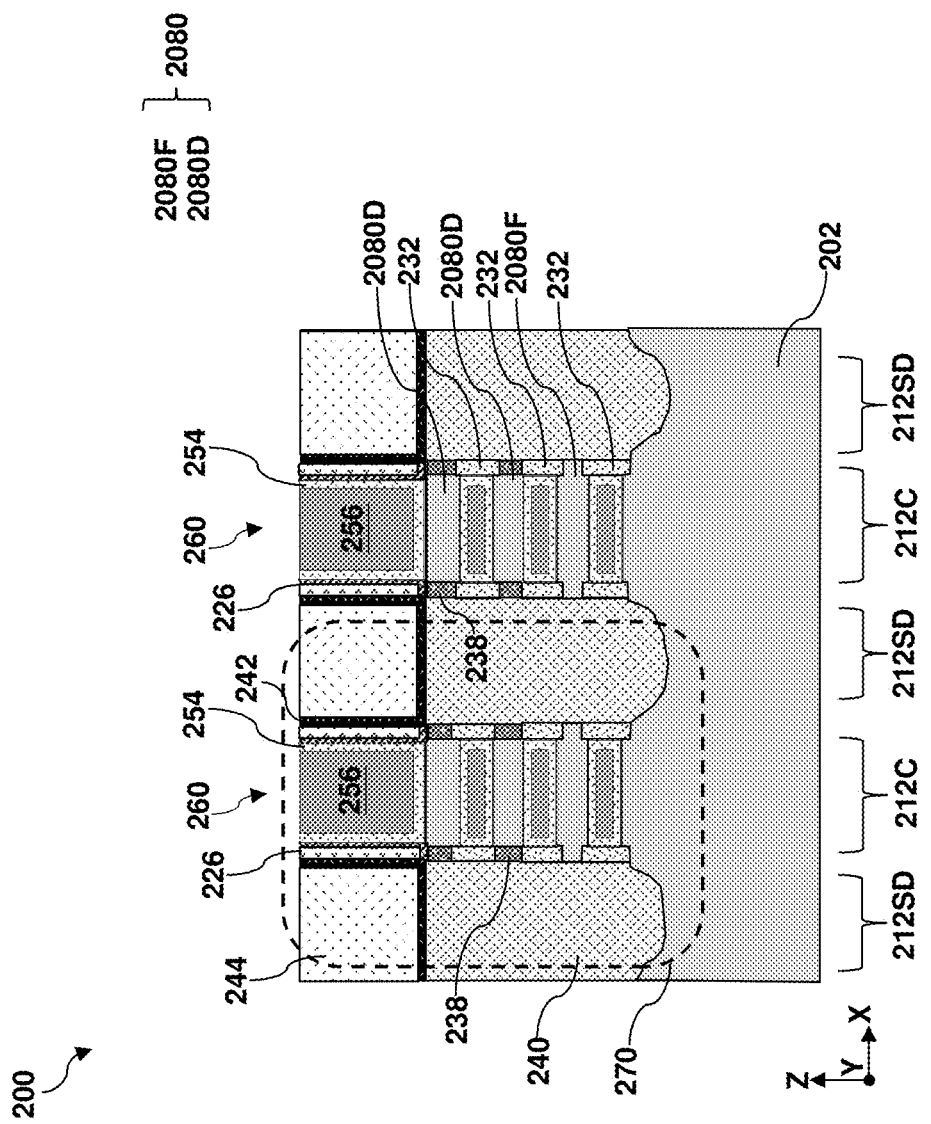

Referring now to FIG. 19, the method 100 may include operations to form the gate structure 260 to wrap around each of the channel members 2080. In some embodiments, the gate structure 260 is formed within the gate trench 246 and into the space 248 left behind by the removal of the sacrificial layers 206. In this regard, the gate structure 260 wraps around each of the channel members 2080, including the functional channel members 2080F and dummy channel members 2080D. The gate structure 260 includes a gate dielectric layer 254 and a gate electrode layer 256 over the gate dielectric layer 254. In some embodiments, while not explicitly shown in the figures, the gate dielectric layer 254 includes an interfacial layer and a high-K gate dielectric layer. High-K dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include hafnium oxide. Alternatively, the high-K gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), $(Ba,Sr)TiO_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The gate electrode layer 256 of the gate structure 260 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 256 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer 256 may be formed by ALD, PVD, CVD, e-beam evaporation, or other suitable process. In various embodiments, a CMP process may be performed to remove excessive metal, thereby providing a substantially planar top surface of the gate structure 260. The gate structure 260 includes portions that interpose between channel members 2080 in the channel region 212C.

Reference is made to FIG. 19. Upon conclusion of the operations at block 122, a first MBC transistor 270 is substantially formed. The first MBC transistor 270 includes a functional channel member 2080F and two dummy channel members 2080D that are vertically stacked along the Z direction. Each of the channel members 2080 of the first MBC transistor 270 is wrapped around by the gate structure 260. The functional channel member 2080F extends or is sandwiched between two source/drain features 240 along the X direction, while the dummy channel members 2080D are insulated from the source/drain features 240 by the blocking features 238. The blocking features 238 shuts off the conduction path between the dummy channel members 2080D and the source/drain features 240, rendering them disabled, deactivated, or shut-off. It can be seen that, when the gate structure 260 of the first MBC transistor 270 is energized, the dummy channel members 2080D may be turned on but are effectively shut off by the blocking features 238. The source/drain features 240 is in contact with the inner spacer features 232, the blocking features 238, the substrate 202, and the functional channel member 2080F. Because two dummy channel members 2080D of the first MBC transistor 270 are not operational, the effective channel width of the first MBC transistor 270 is the channel width of the functional channel member 2080F, which may be about twice the Y-direction dimension of the functional channel member 2080F. Because the dummy channel members 2080D are not operational, the effective resistance of the first MBC transistor 270 is governed by the channel resistance of the functional channel member 2080F.

Figure 20:
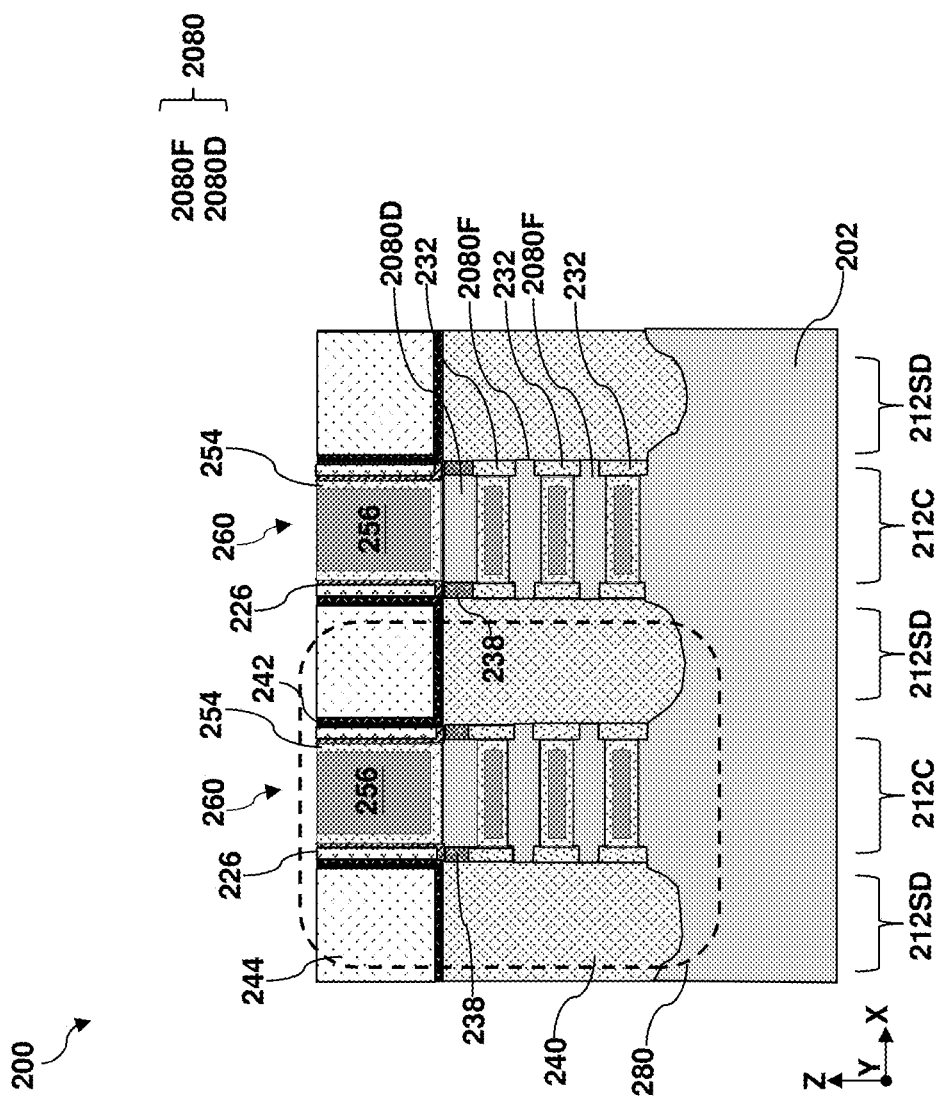
Figure 21:
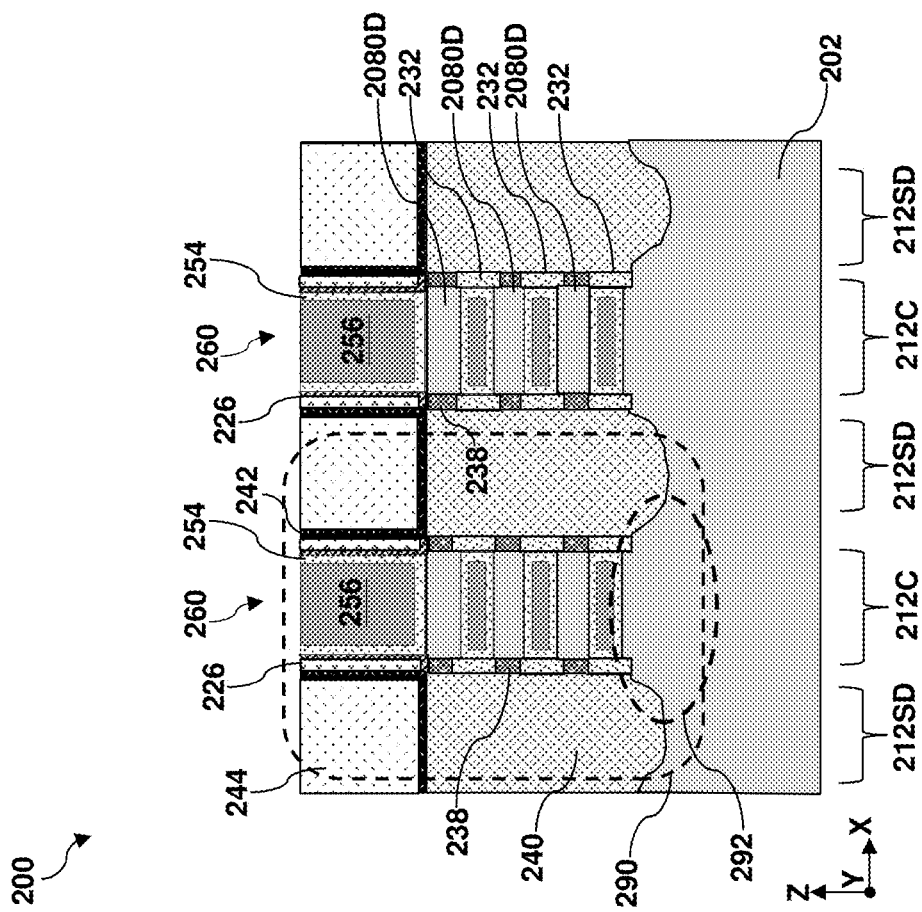
Figure 22:
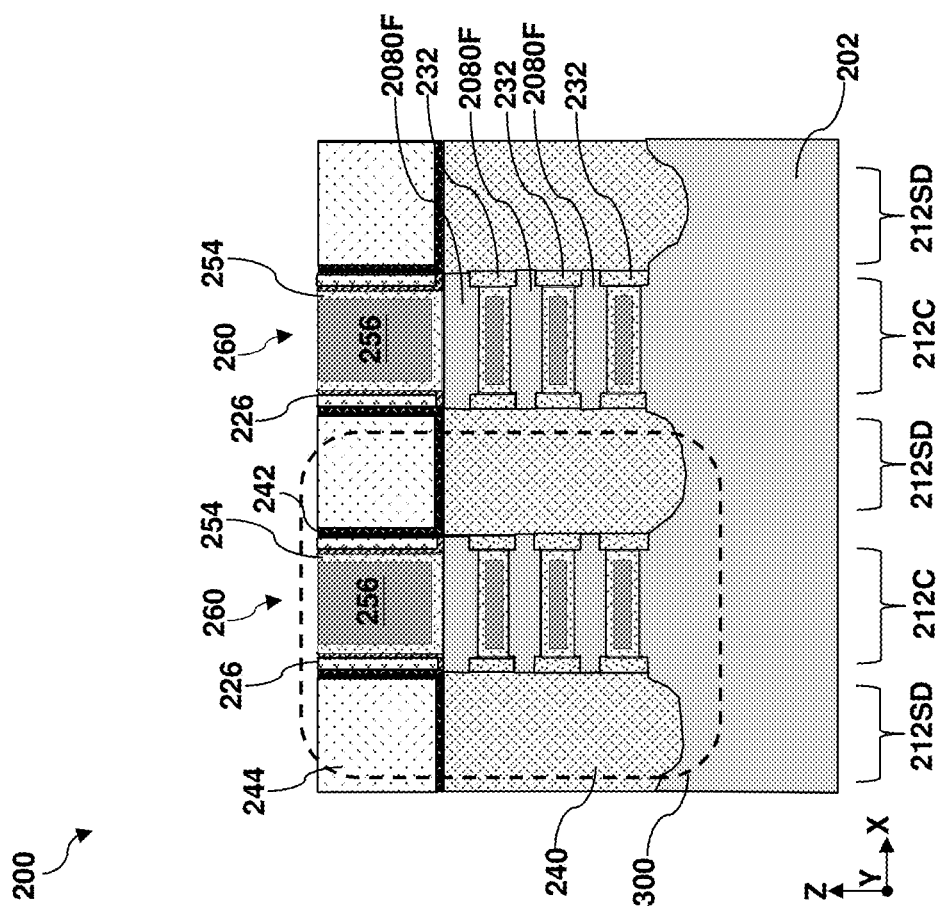

FIGS. 20-22 illustrate alternative MBC transistor embodiments that include different numbers of functional channel members 2080F and dummy channel members 2080D. The MBC transistor embodiments in FIG. 20-22 may also be fabricated using method 100 in FIG. 1 by varying the height of the BARC layer 234 at block 116. FIG. 20 illustrates a semiconductor device 200 that includes a second MBC transistor 280. Unlike the first MBC transistor 270 in FIG. 19, the second MBC transistor 280 includes two functional channel members 2080F and one dummy channel members 2080D stacked over the two functional channel members 2080F. To fabricate the second MBC transistor 280 using method 100, the recessing of the BARC layer 234 at block 116 is performed until that the BARC layer 234 covers/protects two bottom channel layers 208 while the top channel layer 208 is left exposed for trimming. Because the second MBC transistor 280 includes two functional channel members 2080F, the effective channel width of the second MBC transistor 280 is about twice (2) of that of the first MBC transistor 270. Given identical channel member dimensions, the effective resistance of the second MBC transistor 280 is about one-half (½) of that of the first MBC transistor 270 due to the additional functional channel member 2080F.

FIG. 21 illustrates a semiconductor device 200 that includes a third MBC transistor 290. Unlike the first MBC transistor 270 in FIG. 19, the third MBC transistor 290 does not include any functional channel members 2080F. All of the channel members in the third MBC transistor 290 are dummy channel members 2080D. To fabricate the third MBC transistor 290 using method 100, the recessing of the BARC layer 234 at block 116 is performed until that the BARC layer 234 covers/protects all channel layers 208. Because the third MBC transistor 290 does not include any functional channel members 2080F, its channel is in the mesa structure 292 that is a portion of the substrate 202. The third MBC transistor 290 may serve as a reference device or a high threshold voltage transistor. Because the mesa structure 292 provides a leakage path, a drive current of an MBC transistor may be compared against a drive current of the third MBC transistor 290. The difference or surplus of the drive current may be regarded as the net drive current of the MBC transistor after taking account of the leakage current. Because the channel in the mesa structure 292 tends to have a high threshold voltage, the third MBC transistor 290 may also serve as a high threshold voltage (Vt) transistor, an input/output transistor, or an electrostatic discharge (ESD) protection device.

FIG. 22 illustrates a semiconductor device 200 that includes a fourth MBC transistor 300. Unlike the first MBC transistor 270 in FIG. 19, the fourth MBC transistor 300 includes three functional channel members 2080F and no dummy channel members 2080D. To fabricate the fourth MBC transistor 300 using method 100, the recess of the BARC layer 234 at block 116 is performed until that the BARC layer 234 no longer covers/protects any of the channel layers 208. Because the fourth MBC transistor 300 includes three functional channel members 2080F, the effective channel width of the fourth MBC transistor 300 is about three (3) times of that of the first MBC transistor 270. Given identical channel member dimensions, the effective resistance of the fourth MBC transistor 300 is about one-third (⅓) of that of the first MBC transistor 270 due to the two additional functional channel members 2080F. It is noted that while embodiments illustrated in FIGS. 19-22 include three channel members (functional and dummy channel members included), the present disclosure is not so limited. A person of ordinary skill in the art, after reviewing the descriptions and illustrations of the present disclosure, would appreciate that aspects of the present disclosure may be readily applicable to MBC transistors with less or more channel members in their channel regions.

Figure 23:
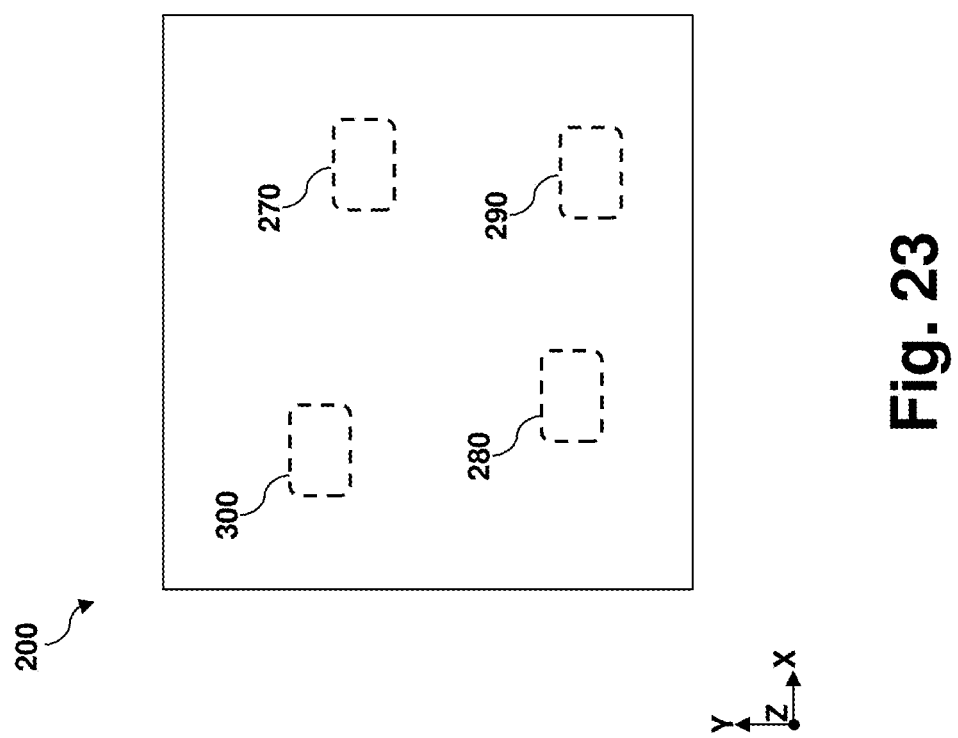
FIG. 23 illustrates a schematic top view of an IC device that includes various MBC transistors, according to one or more aspects of the present disclosure.

Reference is made to FIG. 23. Two or more of the first MBC transistor 270 in FIG. 19, the second MBC transistor 280 in FIG. 20, the third MBC transistor 290 in FIG. 21, and the fourth MBC transistor 300 in FIG. 22 may be fabricated in the same semiconductor device 200. In the depicted embodiment, the semiconductor device 200 includes all four types of MBC transistors. Each of these four types of MBC transistors may serve different functions. In some embodiments, the fourth MBC transistor 300 may serve as a standard transistor while the first MBC transistor 270 and the second MBC transistor 280 may serve as high-resistance transistor. As described above, the effective channel width of the fourth MBC transistor 300 is about three times (3×) of that of the first MBC transistor 270 and is about 1.5 times (1.5×) of that of the second MBC transistor 280. In circuit design, a high-resistance transistor may be regarded as a standard transistor plus a resistor. According, one or more of the standard transistors and one or more of the high-resistance transistors may be connected to form logic gates (e.g., AND, OR, NOR, NAND logic gates) or amplifiers. The third MBC transistor 290 may serve as a reference transistor, a high threshold voltage transistor, an input/output transistor, or an ESD prevention device. Although all four types of MBC transistors are present in the semiconductor device 200 in FIG. 23, the semiconductor device 200 may include two types of the MBC transistors or three types of the MBC transistors. Additionally, different types of MBC transistors according to the present disclosure may be disposed in separate regions or may be placed adjacent to one another.

Figure 24:
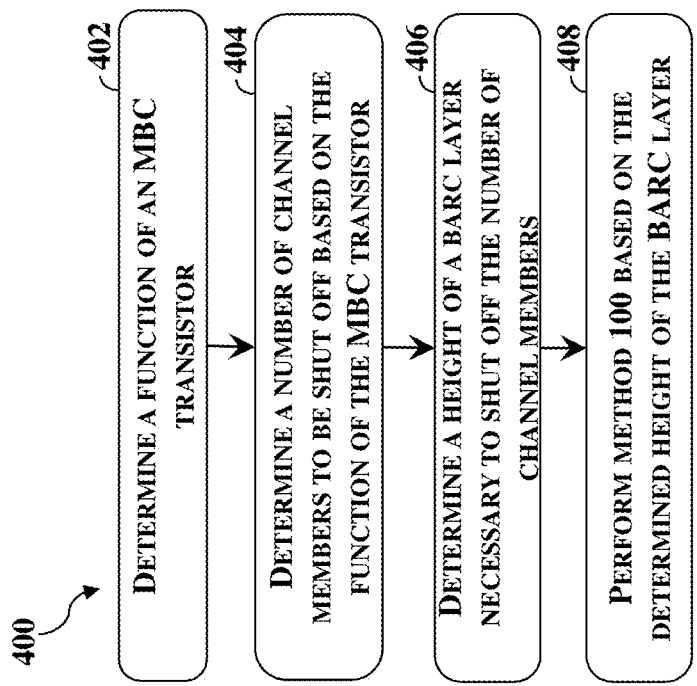
FIG. 24 illustrates a flowchart of a method for determining a parameter for performing the method of FIG. 1, according to one or more aspects of the present disclosure.

FIG. 24 illustrates a flowchart of a method 400 for determining a parameter for the method 100. Method 400 includes a block 402 where a function of an MBC transistor in a semiconductor device is determined. In some embodiments, the function of the MBC transistor in the semiconductor device is determined based on properties of the MBC transistor in the design of the semiconductor device. Such properties may include the effective resistance, effective capacitance, effective channel width, desired drive current, and other aspects of the transistor. Method 400 also includes a block 404 where a number of channel members to be shut off is determined based on the function of the MBC transistors. For example, when the MBC transistor includes three vertically stacked channel members, the function determined at block 402 forms the basis to determine the number of the channel members to be shut off. In this aspect, increasing the number of channel members to be shut off increases the effective resistance and reduces effective channel width of the MBC transistor. Method 400 further includes a block 406 where a height of the BARC layer (along the Z direction in FIGS. 10 and 11) necessary to shut off the number of channel members is determined. As described above with respect to block 116 of method 100 and the alternative embodiments in FIGS. 20-22, the thickness of the BARC layer 234 at block 116 determines how many channel layers will be protected and therefore how many channel members are to be shut off by the blocking features 238. With respect to method 100, a thicker BARC layer 234 protects more channel layers 208 from trimming and leads to more functional channel members 2080F and a thinner BARC layer 234 protects less channel layers 208 from trimming and lead to more dummy channel members 2080D. Finally, at block 408, method 400 performs method 100 based on the determined thickness of the BARC layer 234. To implement the semiconductor device 200 in FIG. 23, method 400 may be performed with respect to each of the device regions. In some embodiments, a photolithography step may be needed for each additional type of MBC transistor to form different heights of the BARC layer 234 in different device regions.

Although not intended to be limiting, one or more embodiments of the present disclosure provide many benefits to a semiconductor device and the formation thereof. For example, methods of the present disclosure may include a blocking feature formation process after the formation of inner spacer features. The blocking feature formation process may form blocking features to selectively shut off a predetermined number of channel members to modulate the effective resistance, effective capacitance, drive current, or frequency to meet various design needs.

In one exemplary aspect, the present disclosure is directed to a semiconductor device. The semiconductor device includes a first source/drain feature and a second source/drain feature over a substrate, a plurality of channel members extending between the first source/drain feature and the second source/drain feature, a gate structure wrapping around each of the plurality of channel members, and at least one blocking feature. At least one of the plurality of channel members is isolated from the first source/drain feature and the second source/drain feature by the at least one blocking feature.

In some embodiments, the gate structure is spaced apart from the first source/drain feature by a plurality of inner spacer features. A composition of the at least one blocking feature is identical to a composition of the plurality of inner spacer features. In some instances, the plurality of channel members includes a bottommost channel member that is nearest to the substrate. The bottommost channel member is coupled to the first source/drain feature and the second source/drain feature. In some instances, all of the plurality of channel members are isolated from the first source/drain feature and the second source/drain feature by the at least one blocking feature. In some embodiments, the plurality of channel members are vertically stacked.

In another exemplary aspect, the present disclosure is directed to a semiconductor device. The semiconductor device includes a first transistor and a second transistor. The first transistor includes a first source/drain feature and a second source/drain feature, a first plurality of channel members extending between and in contact with the first source/drain feature and the second source/drain feature, a first gate structure wrapping around each of the first plurality of channel members. The second transistor includes a third source/drain feature and a fourth source/drain feature, a second plurality of channel members extending between the third source/drain feature and the fourth source/drain feature, a second gate structure wrapping around each of the second plurality of channel members, and first blocking features. One of the second plurality of channel members is isolated from the third source/drain feature and the fourth source/drain feature by the first blocking features.

In some embodiments, an effective channel width of the first transistor is greater than an effective channel width of the second transistor. In some implementations, the semiconductor device may further include a third transistor that includes a fifth source/drain feature and a sixth source/drain feature, a third plurality of channel members extending between the fifth source/drain feature and the sixth source/drain feature, a third gate structure wrapping around each of the third plurality of channel members, and second blocking features. Two of the third plurality of channel members are isolated from the fifth source/drain feature and the sixth source/drain feature by the second blocking features.

In some embodiments, an effective channel width of the second transistor is greater than an effective channel width of the third transistor. In some implementations, the semiconductor device may further include a fourth transistor that includes a seventh source/drain feature and an eighth source/drain feature, a fourth plurality of channel members extending between the seventh source/drain feature and the eighth source/drain feature, a fourth gate structure wrapping around each of the fourth plurality of channel members, and third blocking features, wherein all of the fourth plurality of channel members are isolated from the seventh source/drain feature and the eighth source/drain feature by the third blocking features. In some instances, a threshold voltage of the fourth transistor is greater than a threshold voltage of the first transistor. In some embodiments, the fourth transistor further includes a mesa structure below the fourth plurality of channel members and the fourth gate structure. The mesa structure is in contact with the seventh source/drain feature and the eighth source/drain feature. In some embodiments, the fourth plurality of channel members are vertically stacked. In some implementations, the first plurality of channel members include a first number of channel members, the second plurality of channel members include a second number of channel members, fourth plurality of channel members include a third number of channel members. The first number, the second number, and third number are the same.

In yet another exemplary aspect, the present disclosure is directed to a method. The method includes forming a stack over a substrate, wherein the stack includes a plurality of silicon layers interleaved by a plurality of silicon germanium layers, forming a fin-shaped structure from the stack and the substrate, the fin-shaped structure including a channel region and a source/drain region, recessing the source/drain region to form a source/drain trench that exposes sidewalls of the plurality of silicon layers and the plurality of silicon germanium layers, selectively and partially recessing the plurality of silicon germanium layers to form first inner spacer recesses, forming first inner spacer features in the first inner spacer recesses, depositing a material layer in the source/drain trench to cover sidewalls of at least one of the plurality of silicon layers, after the depositing of the material layer, selectively recessing the plurality of silicon layers that are not covered by the material layer to form second inner spacer recesses, forming second inner spacer features in the second inner spacer recesses, and after the forming of the second inner spacer features, depositing a source/drain feature in the source/drain trench.

In some embodiments, the forming of the second inner spacer features includes depositing an inner spacer material layer over the first inner spacer features and the second inner spacer recesses and etching back the inner spacer material layer. In some implementations, the second inner spacer features are in contact with the at least one of the plurality of silicon layers. In some instances, the material layer includes a bottom antireflective coating (BARC) layer. In some embodiments, a composition of the first inner spacer features is identical to a composition of the second inner spacer features. In some instances, the method may further include determining a function of the semiconductor device, and determining a thickness of the material layer based on the function of the semiconductor device, a thickness of each of the plurality of silicon layers, and a thickness of each of the plurality of silicon germanium layers.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

receiving a workpiece comprising a substrate and a fin-shaped structure disposed over the substrate, the fin-shaped structure extending lengthwise along a first direction and comprising a plurality of channel nanostructures interleaved by a plurality of sacrificial features;

forming a dummy gate stack over a channel region of the fin-shaped structure, the dummy gate stack extending along a second direction perpendicular to the first direction;

depositing at least one gate spacer layer over the workpiece and the dummy gate stack;

recessing a source/drain region of the fin-shaped structure to form a source/drain trench that exposes sidewalls of the plurality of channel nanostructures and the plurality of sacrificial features;

selectively and partially recessing the plurality of sacrificial features to form first recesses;

forming inner spacer features in the first recesses such that the inner spacer features are in direct contact with the sacrificial features;

depositing a covering layer in the source/drain trench to cover sidewalls of a first subset the plurality of channel nanostructures;

after the depositing of the covering layer, selectively and partially recessing a second subset of the plurality of channel nanostructures to form second recesses, wherein the second subset is different from the first subset;

removing the covering layer;

forming channel deactivation features in the second recesses such that the channel deactivation features are in direct contact with the second subset of the plurality of channel nanostructures; and after the forming of the channel deactivation features, depositing a source/drain feature in the source/drain trench such that the source/drain feature is in direct contact with the first subset of the plurality of channel nanostructures.

2. The method of claim 1, wherein the source/drain feature is also in direct contact with the inner spacer features and the channel deactivation features.

3. The method of claim 1, wherein the channel deactivation features electrically insulate the second subset of the plurality of channel nanostructures from the source/drain feature.

4. The method of claim 1, further comprising:
depositing a dielectric layer over the source/drain feature; and
after the depositing of the dielectric layer, planarizing the workpiece to expose the dummy gate stack.

5. The method of claim 3, further comprising:
selectively removing the dummy gate stack;
selectively removing the sacrificial features in the channel region; and
forming a gate structure to wrap around each of the first subset of the plurality of channel nanostructures and the second subset of the channel nanostructures.

6. The method of claim 1, further comprising:
after the forming of the dummy gate stack, depositing a gate spacer layer over the workpiece and the dummy gate stack, wherein at least two of the channel deactivation features are in direct contact with the gate spacer layer.

7. The method of claim 1, wherein the channel nanostructures comprise silicon and the sacrificial features comprise silicon germanium.

8. The method of claim 1, wherein a composition of the inner spacer features is the same as a composition of the channel deactivation features.

9. The method of claim 1, wherein the first subset of the plurality of channel nanostructures are disposed lower than the second subset of the plurality of channel nanostructures.

10. A method, comprising:
forming a fin-shaped structure over a substrate, the fin-shaped structure comprising a plurality of first semiconductor layers interleaved by a plurality of second semiconductor layers;
forming a dummy gate stack over a channel region of the fin-shaped structure;
recessing a source/drain region of the fin-shaped structure to form a source/drain trench that exposes sidewalls of the plurality of first semiconductor layers and the plurality of second semiconductor layers;
selectively and partially recessing end surfaces of the plurality of second semiconductor layers to form first recesses;
forming inner spacer features in the first recesses;
selectively forming channel deactivation features to cap end surfaces of an upper subset of the plurality of first semiconductor layers; and
forming a source/drain feature to be in contact with the channel deactivation features, end surfaces of a lower subset of the plurality of first semiconductor layers, and the inner spacer features.

11. The method of claim 10, wherein the first semiconductor layers comprise silicon and the second semiconductor layers comprise silicon germanium.

12. The method of claim 10, wherein the selectively and partially recessing the end surfaces of the upper subset of the plurality of first semiconductor layers comprises:
depositing a covering layer over the source/drain trench;
etching back the covering layer to cover the end surfaces of the lower subset the plurality of first semiconductor layers while the end surfaces of the upper subset of the plurality of first semiconductor layers are exposed; and
etching the exposed end surfaces of the upper subset of the plurality of first semiconductor layers.

13. The method of claim 12, wherein the source/drain trench extends partially into the substrate.

14. The method of claim 13, wherein the covering layer is in direct contact with the substrate.

15. A method for forming a semiconductor device, comprising:
forming a stack over a substrate, wherein the stack comprises a plurality of silicon layers interleaved by a plurality of silicon germanium layers;
forming a fin-shaped structure from the stack and the substrate, the fin-shaped structure comprising a channel region and a source/drain region;
recessing the source/drain region to form a source/drain trench that exposes sidewalls of the plurality of silicon layers and the plurality of silicon germanium layers;
selectively and partially recessing the plurality of silicon germanium layers to form first inner spacer recesses;
forming first inner spacer features in the first inner spacer recesses;
depositing a material layer in the source/drain trench to cover sidewalls of at least one of the plurality of silicon layers;
after the depositing of the material layer, selectively recessing the plurality of silicon layers that are not covered by the material layer to form second inner spacer recesses;
forming second inner spacer features in the second inner spacer recesses; and
after the forming of the second inner spacer features, depositing a source/drain feature in the source/drain trench.

16. The method of claim 15, wherein the forming of the second inner spacer features comprises:
depositing an inner spacer material layer over the first inner spacer features and the second inner spacer recesses; and
etching back the inner spacer material layer.

17. The method of claim 15, wherein the second inner spacer features are in contact with the at least one of the plurality of silicon layers.

18. The method of claim 15, wherein the material layer comprises a bottom antireflective coating (BARC) layer.

19. The method of claim 15, wherein a composition of the first inner spacer features is identical to a composition of the second inner spacer features.

20. The method of claim 15, further comprising:
determining a function of the semiconductor device; and
determining a thickness of the material layer based on the function of the semiconductor device, a thickness of each of the plurality of silicon layers, and a thickness of each of the plurality of silicon germanium layers.

\* \* \* \* \*